(12) United States Patent
Chung et al.

(10) Patent No.: US 11,575,099 B2
(45) Date of Patent: Feb. 7, 2023

(54) ELECTROLUMINESCENT DEVICE COMPRISING THERMALLY ACTIVATED DELAYED FLUORESCENCE MATERIAL, AND DISPLAY DEVICE COMPRISING THE SAME

(71) Applicant: SAMSUNG ELECTRONICS CO., LTD., Suwon-si (KR)

(72) Inventors: Dae Young Chung, Suwon-si (KR); Hwea Yoon Kim, Suwon-si (KR); Yeonkyung Lee, Seongnam-si (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 211 days.

(21) Appl. No.: 17/030,543

(22) Filed: Sep. 24, 2020

(65) Prior Publication Data
US 2021/0098728 A1 Apr. 1, 2021

(30) Foreign Application Priority Data
Sep. 30, 2019 (KR) .................. 10-2019-0120930

(51) Int. Cl.
*H01L 51/50* (2006.01)
(52) U.S. Cl.
CPC ........ *H01L 51/502* (2013.01); *H01L 51/5004* (2013.01); *H01L 51/5056* (2013.01); *H01L 51/5072* (2013.01); *H01L 51/5088* (2013.01)
(58) Field of Classification Search
CPC combination set(s) only.
See application file for complete search history.

(56) References Cited

U.S. PATENT DOCUMENTS 9,899,619 B2  2/2018 Lee et al.
10,217,953 B2  2/2019 He et al.
(Continued)

FOREIGN PATENT DOCUMENTS

CN  106997889 A  8/2017
CN  106997890 A  8/2017
(Continued)

OTHER PUBLICATIONS

Luhua Lan et al., "Efficient quantum dot light-emitting diodes by balancing charge injection and sensitizing emitting layer with phosphorescent dye," Journal of Materials Chemistry C, Apr. 10, 2019, pp. 1-18.
(Continued)

*Primary Examiner* — Daniel Whalen
(74) *Attorney, Agent, or Firm* — Cantor Colburn LLP

(57) ABSTRACT

An electroluminescent device and a display device including the same. The electroluminescent device includes a first electrode and a second electrode facing each other; a light emitting layer disposed between the first electrode and the second electrode, the light emitting layer including a quantum dot; a hole transport layer disposed between the light emitting layer and the first electrode; and an electron transport layer disposed between the light emitting layer and the second electrode, wherein the hole transport layer, the light emitting layer, or a combination thereof includes thermally activated delayed fluorescence material, and the thermally activated delayed fluorescence material is present in an amount of greater than or equal to about 0.01 wt % and less than about 10 weight percent (wt %), based on 100 wt % of the hole transport layer, the light emitting layer, or the combination thereof including the thermally activated delayed fluorescence material.

19 Claims, 15 Drawing Sheets

(56) References Cited

U.S. PATENT DOCUMENTS

| | | | |
|---|---|---|---|
| 10,305,057 B2 | 5/2019 | He et al. | |
| 10,734,587 B2 | 8/2020 | Parham et al. | |
| 2018/0090709 A1 | 3/2018 | Meng et al. | |
| 2018/0351125 A1 | 12/2018 | He et al. | |
| 2020/0028090 A1 | 1/2020 | Zhang | |
| 2020/0067008 A1* | 2/2020 | Mou | H01L 51/5004 |
| 2020/0373508 A1* | 11/2020 | Li | C09K 11/06 |
| 2021/0091328 A1* | 3/2021 | Sakamoto | H01L 51/5206 |

FOREIGN PATENT DOCUMENTS

| | | |
|---|---|---|
| CN | 106997926 A | 8/2017 |
| CN | 106997927 A | 8/2017 |
| CN | 107808931 A | 3/2018 |
| CN | 109180853 A | 1/2019 |
| JP | 2019508836 A | 3/2019 |
| KR | 101752573 B1 | 6/2017 |
| KR | 101772548 B1 | 8/2017 |
| KR | 101881212 B1 | 7/2018 |
| KR | 20190018573 A | 2/2019 |
| WO | 2015135625 A1 | 9/2015 |

OTHER PUBLICATIONS

Weiye Zhenga et al., "Enhancing the efficiency and the luminance of quantum dot light-emitting diodes by inserting a leaked electron harvesting layer with thermalactivated delayed fluorescence material," Organic Electronics, Nov. 29, 2018, pp. 357-362, vol. 65.

Extended European Search Report dated Dec. 3, 2020, of the corresponding European Patent Application No. 20198450.7.

Hiroki Uoyama et al., "Highly efficient organic light-emitting diodes from delayed fluorescence," Nature, Dec. 13, 2012, pp. 234-238, vol. 492.

* cited by examiner

ELECTROLUMINESCENT DEVICE COMPRISING THERMALLY ACTIVATED DELAYED FLUORESCENCE MATERIAL, AND DISPLAY DEVICE COMPRISING THE SAME

CROSS-REFERENCE TO RELATED APPLICATION

This application claims priority to and the benefit of Korean Patent Application No. 10-2019-0120930 filed in the Korean Intellectual Property Office on Sep. 30, 2019, and all the benefits accruing therefrom under 35 U.S.C. § 119, the content of which in its entirety is herein incorporated by reference.

BACKGROUND

1. Field

An electroluminescent device and a display device comprising thereof are disclosed.

2. Description of the Related Art

Quantum dots are nanocrystals of semiconductor materials with a diameter of several nanometers to several tens of nanometers, which exhibit a quantum confinement effect. Quantum dots may generate stronger light in a narrower wavelength region than phosphors. Quantum dots emit light while excited electrons are transitioned from a conduction band to a valence band and wavelengths are changed depending upon a particle size even of the same material. As wavelengths of light emitted by quantum dots decrease with particle sizes of the quantum dots, quantum dots may provide light in a desirable wavelength region by adjusting sizes of the quantum dots.

In other words, a light emitting layer including quantum dots and various types of electronic devices including the same may save production costs, e.g., provide decreased productions costs, compared with an organic light emitting diode using a light emitting layer including a phosphorescent material, a fluorescent material, or a combination thereof and desirable colors may be emitted by changing sizes of quantum dots, without using other organic materials in the light emitting layer for emitting lights of other colors.

SUMMARY

An embodiment provides an electroluminescent device having improved luminous efficiency and life-span and a display device including the same.

According to an embodiment, an electroluminescent device includes a first electrode and a second electrode facing each other; a light emitting layer disposed between the first electrode and the second electrode, the light emitting layer including a quantum dot; a hole transport layer disposed between the light emitting layer and the first electrode; and an electron transport layer disposed between the light emitting layer and the second electrode, wherein the hole transport layer, the light emitting layer, or a combination thereof includes a thermally activated delayed fluorescence material, and the thermally activated delayed fluorescence material is present in an amount of greater than or equal to about 0.01 weight percent (wt %) and less than about 10 wt %, based on 100 wt % of the hole transport layer, the light emitting layer, or the combination thereof including the thermally activated delayed fluorescence material.

The hole transport layer may include the thermally activated delayed fluorescence material and a material having a hole transporting property, and a difference between a highest occupied molecular orbital (HOMO) energy level of the thermally activated delayed fluorescence material and a HOMO energy level of the material having the hole transporting property may be in a range of about −1.0 electronvolts (eV) to about 1.0 eV.

The hole transport layer may be directly on the light emitting layer.

The thermally activated delayed fluorescence material may have a highest occupied molecular orbital) energy level of about −6.1 eV to about −5.2 eV and a lowest unoccupied molecular orbital) energy level of about −3.6 eV to about −2.0 eV.

The thermally activated delayed fluorescence material may include 9'-[4-(4,6-diphenyl-1,3,5-triazin-2-yl)phenyl]-3,3'', 6,6''-tetraphenyl-9,3':6',9''-ter-9H-carbazole (BDPCC-TPTA), 2,3,4,6-tetra(9H-carbazol-9-yl)-5-fluorobenzonitrile (4CzFCN), 10,10'-(4,4'-sulfonyl bis(4,1-phenylene)) bis(9,9-dimethyl-9,10-dihydroacridine) (DMAC-DPS), 9'-[4-(4,6-diphenyl-1,3,5-triazin-2-yl)phenyl]-9,3':6',9''-ter-9H-carbazole (BCC-TPTA), 9,9'-(5-(4,6-diphenyl-1,3,5-triazin-2-yl)-1,3-phenylene)bis(9H-carbazole) (DCzTrz), 9,9',9'',9'''-(6-phenyl-1,3,5-triazine-2,4-diyl)bis(benzene-5,3,1-triyl)) tetrakis (9H-carbazole) (DDCzTrz), 9,9'-(4,4'-sulfonylbis(4,1-phenylene))bis(3,6-di-tert-butyl-9H-carbazole) (CZ-PS), 10,10'-(4,4'-(4-phenyl-4H-1,2,4-triazole-3,5-diyl)bis(4,1-phenylene))bis(10H-phenoxazine) (2PXZ-TAZ), or a combination thereof.

The thermally activated delayed fluorescence material may have a peak emission wavelength of less than or equal to about 480 nanometers (nm).

The light emitting layer may include the thermally activated delayed fluorescence material, and a difference between a HOMO energy level of the thermally activated delayed fluorescence material and a HOMO energy level of the quantum dots may satisfy about −1.0 eV to about 1.0 eV.

The light emitting layer includes a first layer directly on the hole transport layer and a second layer disposed between the first layer and the electron transport layer, and wherein an amount of thermally activated delayed fluorescence material present in the first layer may be greater than an amount of the thermally activated delayed fluorescence material present in the second layer.

Each of the first layer and the second layer may emit a first light belonging to a same predetermined wavelength region.

The first light may belong to a first wavelength region of about 380 nm to about 488 nm, a second wavelength region of about 490 nm to about 510 nm, a third wavelength region of about 511 nm to about 580 nm, a fourth wavelength region of about 582 nm to about 600 nm, or a fifth wavelength region of about 620 nm to about 680 nm.

Each of the first layer and the second layer may have a thickness of about 1 nm to about 30 nm.

The second layer may have a thickness less than or equal to the first layer.

The quantum dot may include a Group II-VI compound that does not include Cd, a Group III-V compound, a Group IV-VI compound, a Group IV element or compound, a Group compound, a Group I-II-IV-VI compound that does not include Cd, or a combination thereof.

The quantum dot may have a core-shell structure.

A hydrophobic ligand may be attached to a surface of the quantum dots.

The electron transport layer may include an inorganic nanoparticle, a quinolone compound, a triazine compound, a quinoline compound, a triazole compound, a naphthalene compound, or a combination thereof.

The electron transport layer may include a population layer comprising inorganic nanoparticles.

The electroluminescent device may further include a hole injection layer between the first electrode and the hole transport layer.

According to an embodiment, a display device including the electroluminescent device is provided.

An electroluminescent device having improved luminous efficiency and life-span and a display device including the same are provided.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
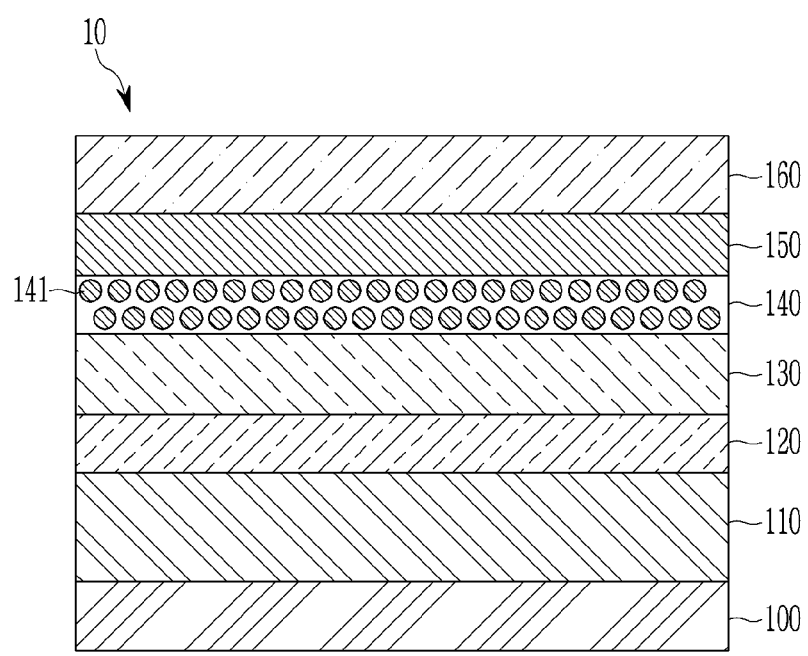
FIG. 1 is a schematic cross-sectional view of an electroluminescent device according to an embodiment.

Example embodiments of the present disclosure will hereinafter be described in detail, and may be easily performed by a person having an ordinary skill in the related art. However, this disclosure may be embodied in many different forms, and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer" or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/ or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "thickness" refers to "an average thickness". The "average thickness" means an arithmetic mean value of thicknesses of measurement objects (e.g., layers, etc.) obtained from scanning electron microscope images at random from several times to several tens of times.

As used herein, "Group" refers to a group of Periodic Table.

As used herein, "Group I" refers to Group IA and Group IB, and examples may include Li, Na, K, Rb, and Cs, but are not limited thereto.

As used herein, "Group II" refers to Group IIA and Group IIB, and examples of Group II metal may be Cd, Zn, Hg, and Mg, but are not limited thereto.

As used herein, examples of "Group II metal that does not include Cd" refers to a Group II metal except Cd, for example Zn, Hg, Mg, etc.

As used herein, "Group III" refers to Group IIIA and Group IIIB, and examples of Group III metal may be Al, In, Ga, and Tl, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

An electroluminescent device including quantum dots (hereinafter referred to as a quantum dot electroluminescent device) may be a next generation display device due to high color reproducibility of quantum dots and ease of solution processing.

However, in the quantum dot electroluminescent device, the flow of holes in the light emitting layer including the quantum dots may not be smooth compared with the flow of electrons in an electric field of a constant intensity. Accordingly, improvements in a quantum dot electroluminescent device may be desirable.

Luminous efficiency of a light emitting layer including quantum dots may be determined by quantum efficiency of quantum dots, a balance of charge carriers, light extraction efficiency, and the like. In order to improve quantum efficiency, excitons may be confined in the light emitting layer, but when the excitons are not confined in the light emitting layer by a variety of factors, a problem such as exciton quenching may be caused.

Charges (electrons, holes) injected toward the light emitting layer may be recombined near the interface of the hole transport layer and the light emitting layer, or the interface. Herein, excitons inside the quantum dot electroluminescent device may be trapped and quenched by an energy level generated by a conduction band present on or around, e.g., near, the interface of the hole transport layer and the light emitting layer.

The injected electrons and holes may be recombined and form excitons in a non-light emitting layer (the hole transport layer) rather than the light emitting layer. Herein, the excitons formed in the non-light emitting layer may not contribute to light emission of the quantum dot electroluminescent device but be quenched and thus deteriorate efficiency thereof.

Excess electrons not recombined among the injected electrons and holes may be still present on the interface of the hole transport layer and the light emitting layer and thus cause degradation of the hole transport layer (specifically, degradation of a material having a hole transporting property included in the hole transport layer). In addition, the excess electrons may cause a surface defect on the interface of the hole transport layer, the light emitting layer, or a combination thereof. The surface defect may not only trigger the quench of the excitons but also accelerate luminance deterioration of the device when driven at a constant current.

Provided is a method of preventing the degradation of the hole transport layer by the excess electrons in the quantum dot electroluminescent device and improving luminous efficiency thereof.

The present inventors discovered a method of securing excellent luminous efficiency by not quenching but recycling the excitons formed in the hole transport layer as well as securing excellent life-span characteristics by decreasing or minimizing the degradation of the hole transport layer, when the light emitting layer, the hole transport layer, or a combination thereof of the quantum dot electroluminescent device includes a predetermined amount of a thermally activated delayed fluorescence material (a thermally activated delayed fluorescence material).

Accordingly, referring to FIG. 1, a schematic configuration of an electroluminescent device according to an embodiment will be described.

FIG. 1 is a cross-sectional view schematically showing an electroluminescent device according to an embodiment.

An electroluminescent device 10 according to an embodiment includes a first electrode 110 and a second electrode 160 facing each other, a light emitting layer 140 disposed between the first electrode 110 and the second electrode 160 and including quantum dots 141, a hole transport layer 130 disposed between the first electrode 110 and the light emitting layer 140, a hole injection layer 120 that is disposed between the first electrode 110 and the hole transport layer 130 and is optionally omitted taking into consideration the relationship with each constituent element, and an electron transport layer 150 disposed between the light emitting layer 140 and the second electrode 160.

That is, the electroluminescent device 10 has a stacked structure in which the hole injection layer 120, the hole transport layer 130, the light emitting layer 140, and the electron transport layer 150 are sequentially disposed between the first electrode 110 and the second electrode 160 facing each other.

In the electroluminescent device 10 according to an embodiment, the hole transport layer 130, the light emitting layer 140, or a combination thereof may include the thermally activated delayed fluorescence material as described herein.

In an embodiment, the thermally activated delayed fluorescence material may be included within a predetermined amount range, for example greater than or equal to about 0.01 wt % and less than about 10 wt %, based on 100 wt % of the layer including the thermally activated delayed fluorescence material of the hole transport layer 130 and the light emitting layer 140.

For example, when the thermally activated delayed fluorescence material is included in the hole transport layer 130, the thermally activated delayed fluorescence material may be included in the hole transport layer 130 in an amount of about 0.01 wt % to about 10 wt %, based on 100 wt % of the hole transport layer 130. The amount may be same if the thermally activated delayed fluorescence material is included in the light emitting layer 140.

When the thermally activated delayed fluorescence material is contained in both of the hole transport layer 130 and the light emitting layer 140, the thermally activated delayed fluorescence material may be included in an amount of greater than or equal to about 0.01 wt % and less than about 10 wt % in the hole transport layer 130, based on 100 wt % of the hole transport layer 130 and the thermally activated delayed fluorescence material may be included in an amount of greater than or equal to about 0.01 wt % and less than about 10 wt % in the light emitting layer 140, based on 100 wt % of the light emitting layer 140.

As such, when the thermally activated delayed fluorescence material is included in the hole transport layer 130, the light emitting layer 140, or a combination thereof in the disclosed range, the electroluminescent device 10 according to an embodiment exhibits improved life-span and luminous efficiency. Details thereof will be described herein.

In an embodiment, the first electrode 110 may be directly connected to a driving power source so may function to flow current to the light emitting layer 140. The first electrode 110 may include a material having light transmittance in at least visible light wavelength region, but is not necessarily limited thereto. The first electrode 110 may include a material having light transmittance in an infrared or ultraviolet (UV) wavelength region. For example, the first electrode 110 may be an optically transparent material.

In an embodiment, the first electrode 110 may include molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

However, the first electrode 110 according to an embodiment is not necessarily limited thereto but may include a material further having light transmittance with respect to light in an infrared or ultraviolet (UV) wavelength region or a semi-transmittable material selectively transmitting light in a particular wavelength region and conduct a function of reflecting light in a visible light wavelength region back toward the second electrode 160.

In an embodiment, the first electrode 110 may be disposed on the substrate 100 as shown in FIG. 1. The substrate 100 may be a transparent insulating substrate or may be made of a ductile material. The substrate 100 may include glass or a polymer material in a film having a glass transition temperature (Tg) of greater than about 150° C. For example, the substrate may include a COC (cycloolefin copolymer) or COP (cycloolefin polymer) based material.

In an embodiment, the substrate 100 may support the hole injection layer 120, the transport layer 130, the light emitting layer 140, and the electron transport layer 150 disposed between the first electrode 110 and the second electrode 160. However, the substrate 100 of the electroluminescent device 10 according to an embodiment may not be disposed under the first electrode 110, but the substrate 100 may be disposed on the second electrode 160 or may be omitted, as desired.

The second electrode 160 includes an optically transparent material and may function as a light-transmitting electrode to transmit light generated in the light emitting layer 140. In an embodiment, the second electrode 160 may include silver (Ag), aluminum (Al), copper (Cu), gold (Au), an alloy thereof, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

However, the second electrode 160 according to an embodiment is not necessarily limited thereto but may include a semi-transmittable material selectively transmitting light in a particular wavelength region, and conduct a function of reflecting light in a visible light wavelength region back toward the first electrode 110.

When the second electrode 160 functions as a reflecting electrode, the first electrode 110 may be a light-transmitting electrode formed of a material transmitting light in at least visible light wavelength region or a semi-transmittable electrode selectively transmitting light in a particular wavelength region.

Each of the first electrode 110 and the second electrode 160 may be formed by depositing a material for forming an electrode on the substrate 100 or an organic layer by a method such as sputtering.

As shown in FIG. 1, an electroluminescent device 10 according to an embodiment may have a structure wherein the substrate 100 and each of constituent elements are disposed in the aforementioned stacking order.

However, the electroluminescent device 10 according to an embodiment is not necessarily limited thereto but may have various structures satisfying the aforementioned stacking order of each constituent element. For example, when the substrate 100 is disposed not beneath the first electrode 110 but on the second electrode 160, the electroluminescent device 10 may have an inverted structure.

The hole injection layer 120 may be disposed directly on the first electrode 110. The hole injection layer 120 may supply holes into the light emitting layer 140 together with the hole transport layer 130. However, the hole injection layer 120 may be omitted taking into consideration the thickness and the material of the hole transport layer 130.

The hole injection layer 120 may be formed of a p-type semiconductor material or a material doped with a p-type dopant. For example, the hole injection layer 120 may include poly(3,4-ethylenedioxythiophene) (PEDOT) or a derivative thereof, PSS [poly(styrene sulfonate)] or a derivative thereof, poly-N-vinylcarbazole (PVK) or a derivative thereof, polyphenylenevinylene or a derivative thereof, poly p-phenylene vinylene (PPV) or a derivative thereof, polymethacrylate or a derivative thereof, poly(9,9-dioctylfluorene) or a derivative thereof, poly(spiro-bifluorene) or a derivative thereof, tris(4-carbazol-9-yl phenyl)amine (TCTA) or a derivative thereof, N,N'-diphenyl-N,N'-bis(3-methylphenyl)-(1,1'-biphenyl)-4,4'-diamine (TPD) or a derivative thereof, N,N'-di(naphthalen-1-yl)-N-N'-diphenylbenzidine (NPB) or a derivative thereof, tris(3-methylphenylphenylamino)-triphenylamine (m-MTDATA) or a derivative thereof, poly[(9,9-dioctylfluoren-2,7-diyl)-co-(4,4'-(N-4-butylphenyl)diphenylamine)] (TFB) or a derivative thereof, poly[(9,9-dioctylfluorene)-co-(N,N'-diphenyl-N,N'-di-(p-butylphenyl)-1,4-diaminobenzene)] (PFB) or a derivative thereof, poly-TPD or a derivative thereof, a metal oxide such as NiO or $MoO_3$, or a combination thereof, but is not necessarily limited thereto.

The hole transport layer 130 may be disposed on the first electrode 110, for example on the first electrode 110 and the hole injection layer 120. The hole transport layer 130 may provide and transport holes into the light emitting layer 140. The hole transport layer 130 may be formed directly under the light emitting layer 140 to contact the light emitting layer 140, e.g., the hole transport layer 130 may be directly on the light emitting layer 140.

In an embodiment, the hole transport layer 130 may include a material having a hole transporting property. The material having the hole transporting property may be a p-type semiconductor material, or a material doped with a p-type dopant. The material having the hole transporting property is not limited to a specific material but may be a polymer, an oligomer, a metal oxide, or a combination thereof.

Examples of the material having the hole transporting property may include poly(3,4-ethylenedioxythiophene) (PEDOT) or a derivative thereof, poly(styrene sulfonate) (PSS) or a derivative thereof, poly-N-vinylcarbazole (PVK) or a derivative thereof, polyphenylenevinylene or a derivative thereof, poly p-phenylene vinylene (PPV) or a derivative thereof, polymethacrylate or a derivative thereof, poly (9,9-dioctylfluorene) or a derivative thereof, poly(spirobifluorene) or a derivative thereof, tris(4-carbazol-9-yl phenyl)amine (TCTA) or a derivative thereof, N,N'-diphenyl-N,N'-bis(3-methylphenyl)-(1,1'-biphenyl)-4,4'-diamine (TPD) or a derivative thereof, N,N'-di(naphthalen-1-yl)-N-N'-diphenyl-benzidine (NPB) or a derivative thereof, tris(3-methylphenylphenylamino)-triphenylamine (m-MTDATA) or a derivative thereof, poly[(9,9-dioctylfluoren-2,7-diyl)-co-(4,4'-(N-4-butylphenyl)diphenylamine)] (TFB) or a derivative thereof, poly[(9,9-dioctylfluorene)-co-(N,N'-diphenyl-N,N'-di-(p-butylphenyl)-1,4-diaminobenzene)] (PFB) or a derivative thereof, poly-TPD or a derivative thereof, a metal oxide such as NiO or $MoO_3$, or a combination thereof, but is not necessarily limited thereto.

In an embodiment, a thickness of the hole transport layer 130 may be varied taking into consideration the charge carrier balance with the hole injection layer 120, the hole transport layer 130, the light emitting layer 140, or a combination thereof in the device, the optical recycling by the thermally activated delayed fluorescence material that is described herein, and the like. A thickness of the hole transport layer 130 may be for example greater than or equal to about 10 nm, for example greater than or equal to about 20 nm, and for example less than or equal to about 80 nm, less than or equal to about 70 nm, less than or equal to about 60 nm, or less than or equal to about 50 nm, or for example about 10 nm to about 80 nm, about 10 nm to about 70 nm, about 10 nm to about 60 nm, about 10 mm to about 50 nm, or about 10 nm to about 40 nm.

For example, the hole transport layer 130 may be formed in a wet coating method such as spin-coating. For example, both of the hole transport layer 130 and the light emitting layer 140 may be formed in a wet coating method. In this way, the hole transport layer 130, the light emitting layer 140, or a combination thereof may be formed in a simple process.

In addition, in an embodiment, the hole transport layer 130 and the light emitting layer 140 may be made of materials having relatively different solubilities. For example, the hole transport layer 130 may be prepared using a material having excellent solubility for an aromatic non-polar solvent, while the light emitting layer 140 may be prepared using a material having excellent solubility for an aliphatic non-polar solvent. Accordingly, the hole transport layer 130 and the light emitting layer 140 may be prepared to contact one another using a solution process, e.g., the hole transport layer 130 may be directly on the light emitting layer 140, and the light emitting layer 140 may be formed without surface damage of the hole transport layer 130 due to the different solubility of the hole transport layer 130 and the light emitting layer 140.

For example, when a TFB polymer film is formed as the hole transport layer 130, a precursor solution including a TFB precursor polymer and an aromatic non-polar solvent (e.g., toluene, xylene, etc.) is spin-coated on the first electrode 110 or the hole injection layer 120, thermal treatment is performed in an inert gas atmosphere of $N_2$ or in a vacuum at a temperature of about 150° C. to about 180° C. for about 30 minutes to form a hole transport layer 130 made of TFB, and the light emitting layer 140 may be easily formed thereon using an aliphatic non-polar solvent (e.g., octane, nonane, cyclohexane, etc.) using a solution process.

As such, when the hole transport layer 130 and the light emitting layer 140 is configured to have different relative solubility, the formation of the hole transport layer 130 and the light emitting layer 140 using a solution process is more easily performed, and the surface damage of the hole transport layer 130 by organic solvents may be decreased or minimized during the subsequent formation of the light emitting layer 140.

The light emitting layer 140 may be disposed on the hole transport layer 130 and the quantum dots 141 may be included.

The light emitting layer 140 is a site where electrons and holes transported by a current supplied from the first electrode 110 and the second electrode 160, the electrons and holes are combined in the light emitting layer 140 to generate excitons, and the generated excitons are transitioned from an exited state to a ground state to emit light in a wavelength corresponding to the sizes of the quantum dots 141. That is, the quantum dots 141 impart electroluminescence to the light emitting layer 140.

The quantum dots 141 have a discontinuous bandgap energy by the quantum confinement effect and incident light may be converted into light having a particular wavelength and then radiated. Accordingly, the light emitting layer 140 including the quantum dots 141 may produce light having excellent color reproducibility and color purity.

For example, the light emitting layer 140 may emit light in a predetermined wavelength region. The predetermined wavelength region may belong to a visible light region, for example, a first wavelength region of about 380 nm to about 488 nm, a second wavelength region of about 490 nm to about 510 nm, a third wavelength region of about 510 nm to about 580 nm, a fourth wavelength region of about 582 nm to about 600 nm, or a fifth wavelength region of about 620 nm to about 680 nm.

In an embodiment, materials of the quantum dots 141 are not particularly limited and commercially available quantum dots may be used. For example, each of the quantum dots 141 according to an embodiment may include a Group II-VI compound that does not include Cd, a Group III-V compound, a Group IV-VI compound, a Group IV element or compound, a Group compound, a Group I-II-IV-VI compound that does not include Cd, or a combination thereof. That is, each of the quantum dots 141 according to an embodiment may be a cadmium-free quantum dot. The quantum dots 141 may not include cadmium, e.g., the quantum dots 141 may consist of cadmium-free materials, and the quantum dots 141 may have a minimum amount or no toxicity compared with cadmium-based quantum dots and thus may not be dangerous and may be environmentally-friendly.

The Group II-VI compound may be a binary element compound such as ZnS, ZnSe, ZnTe, ZnO, HgS, HgSe, HgTe, MgSe, MgS, or a combination thereof; a ternary element compound such as ZnSeS, ZnSeTe, ZnSTe, HgSeS, HgSeTe, HgSTe, HgZnS, HgZnSe, HgZnTe, MgZnSe, MgZnS, or a combination thereof; a quaternary element compound such as HgZnTeS, HgZnSeS, HgZnSeTe, HgZn-STe, or a combination thereof; or a combination thereof. The Group II-VI compound may further include a Group III metal.

The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, InZnP, or a combination thereof; a quaternary element compound such as GaAlNP, GaAlNAs, GaAlNSb, GaAlPAs, GaAlPSb, GaInNP, GaIn-NAs, GaInNSb, GaInPAs, GaInPSb, InAlNP, InAlNAs, InAlNSb, InAlPAs, InAlPSb, or a combination thereof; or a combination thereof. The Group III-V compound may further include a Group II metal (InZnP).

The Group IV-VI compound may be a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof. Examples of the Group compound may be CuInSe$_2$, CuInS$_2$, CuInGaSe, and CuInGaS, but are not limited thereto. Examples of the Group I-II-IV-VI compound may be CuZnSnSe and CuZnSnS, but are not limited thereto. Examples of the Group IV compound may be a single substance such as Si, Ge, or a combination thereof; a binary element compound such as SiC, SiGe, or a combination thereof; or a combination thereof.

The binary element compound, the ternary element compound, or the quaternary element compound respectively exists in a uniform concentration in the particle or in partially different concentrations in the same particle.

According to an embodiment, the quantum dots may have a core-shell structure including one semiconductor nanocrystal particle (core) and another semiconductor nanocrystal shell surrounding the core. The interface between the core and the shell may have a concentration gradient wherein a concentration of the element(s) of the shell decreases toward the center. In an embodiment the quantum dots may have a structure (core-single shell structure) including one core and one layer of shell surrounding it. In this case, the single shell structure may have a single composition or concentration gradient.

However, an embodiment is not necessarily limited thereto, and the quantum dots may have a structure including one core and a multi-layered shell surrounding the core. Herein, the multi-layered shell structure has a structure of two or more shells and each layer may have a single composition or an alloy or may have a concentration gradient.

When the quantum dots have a core-shell structure, a material composition of the shell may have a larger, e.g., greater, bandgap energy than a bandgap energy of the core, which may exhibit an effective quantum confinement effect. However, the embodiment is not limited thereto. In the multi-layered shell, a shell that is outside of the core may have a higher, e.g., greater, bandgap energy than a shell that is near, e.g., closer to, the core and quantum dots may have a peak emission wavelength within an ultraviolet (UV) to infrared range.

The quantum dots may have quantum efficiency of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 90%, or even 100%.

In a display, the quantum dots may have a relatively narrow emission wavelength spectrum and color purity or color reproducibility may be improved. The quantum dots may have for example a full width at half maximum (FWHM) of an emission wavelength spectrum of less than or equal to about 45 nm, less than or equal to about 40 nm, or less than or equal to or about 30 nm. Within the ranges, color purity or color reproducibility of a device may be improved.

The quantum dots may have a particle diameter (the longest size for a non-spherically shaped particle) of about 1 nm to about 100 nm. For example, the quantum dots may have a particle diameter (the longest size for a non-spherically shaped particle) of about 1 nm to about 20 nm, for example about 2 nm to about 20 nm, about 3 nm to about 20 nm, about 3 nm to about 15 nm, or about 5 nm to about 15 nm.

In addition, the shapes of the quantum dots may not be particularly limited. For example, the quantum dots may have a spherical, oval, tetrahedral, pyramidal, cuboctahedral, cylindrical, polyhedral, multi-armed, or cube nanoparticle, nanotube, nanowire, nanofiber, nanosheet, or a combination thereof. The quantum dots may have any suitable cross-sectional shape.

The quantum dots may be commercially available or may be synthesized in any suitable method. For example, several nanometer-sized quantum dots may be synthesized according to a wet chemical process. In the wet chemical process, precursors react in an organic solvent to grow crystal particles, and the organic solvent or a ligand compound may coordinate the surface of the quantum dot, controlling the growth of the crystal.

The organic solvent coordinated on, e.g., bound to, the surface of the quantum dots may affect stability of a device, and thus excess organic materials that are not coordinated on the surface of the nanocrystals may be removed by pouring in excess non-solvent, and centrifuging the resulting mixture. Examples of the non-solvent may be acetone, ethanol, methanol, and the like, but are not limited thereto. After the removal of excess organic materials, the amount of the organic materials coordinated on the surface of the quantum dots may be less than or equal to about 50% by weight, for example, less than or equal to about 30 wt %, less than or equal to about 20 wt %, or less than or equal to about 10 wt %, based on a weight of the quantum dots. The organic material may include a ligand compound, an organic solvent, or a combination thereof.

In the electroluminescent device 10 according to an embodiment, a ligand having a hydrophobic moiety (hereinafter, hydrophobic ligand) may be attached to the surfaces of the quantum dots 141. In an embodiment, the hydrophobic ligand may include a functional group that performs interactions with the surfaces of the quantum dots 141 and a hydrophobic functional group that imparts hydrophobicity. The interactions may be chemical interactions (e.g., chemical bond), interactions with electrostatic attractive force (e.g., Van der Waals bonding), or a combination thereof.

The hydrophobic moiety may be for example a C4 to C20 alkyl group, a C4 to C20 alkenyl group, a C4 to C20 alkynyl group, or a combination thereof and the functional group that performs interactions with the surfaces of the quantum dots 141 may be for example a hydroxy group (—OH), a carboxy group (—COOH), a carboxylate group (—COO$^-$), a phosphonic acid group (—PO$_3$H$_2$), a phosphoryl group (—PO$_3^{2-}$), and the like.

Examples of the hydrophobic ligand may be a fatty acid such as oleic acid, stearic acid, palmitic acid, and the like. When the hydrophobic ligand is included as described, the quantum dots 141 may exhibit non-polarity, and the light emitting layer 140 including the same may exhibit non-polarity. The quantum dots 141 having the attached hydrophobic ligand may have solvent selectivity for a non-polar solvent, specifically an aliphatic non-polar solvent.

The electroluminescent device 10 according to an embodiment may include the quantum dots 141 in a predetermined amount in order to exhibit improved luminous efficiency of the light emitting layer 140.

For example the quantum dots 141 may be included in an amount of for example greater than or equal to about 5 wt %, greater than or equal to about 10 wt %, greater than or equal to about 15 wt %, or greater than or equal to about 20 wt %, and less than or equal to about 98 wt %, less than or equal to about 95 wt %, less than or equal to about 90 wt %, less than or equal to about 85 wt %, less than or equal to about 80 wt %, less than or equal to about 75 wt %, less than or equal to about 70 wt %, less than or equal to about 65 wt %, less than or equal to about 60 wt %, less than or equal to about 55 wt %, or less than or equal to about 50 wt %, or for example about 5 wt % to about 98 wt %, about 20 wt % to about 98 wt %, about 20 wt % to about 90 wt %, about 20 wt % to about 85 wt %, about 50 wt % to about 85 wt %, or about 50 wt % to about 80 wt %, based on 100 wt % of the light emitting layer.

However, an embodiment is not limited thereto and the amounts of the quantum dots 141 may be different according to amounts of the thermally activated delayed fluorescence material in the light emitting layer 140, materials of the used quantum dots 141, wavelength ranges of emitted light, amounts of used hydrophobic ligands, and thicknesses of the hole transport layer 130, the light emitting layer 140, the electron transport layer 150, or a combination thereof.

In an embodiment, the electron transport layer 150 is disposed between the light emitting layer 140 and the second electrode 160 and thus transports electrons into the light emitting layer 140.

In an embodiment, a thickness of the electron transport layer 150 may be variously changed taking into consideration charge carrier balance of the hole injection layer 120, the hole transport layer 130, the light emitting layer 140, or a combination thereof in the device, but may be for example greater than or equal to about 20 nm, greater than or equal to about 30 nm, greater than or equal to about 40 nm, or greater than or equal to about 50 nm, and for example less than or equal to about 100 nm, less than or equal to about 90 nm, less than or equal to about 80 nm, less than or equal to about 70 nm, or less than or equal to about 60 nm, or for example about 20 nm to about 100 nm, about 20 nm to about 90 nm, about 30 nm to about 80 nm, about 40 mm to about 80 nm, or about 60 nm to about 80 nm.

When the electron transport layer 150 has a thickness outside of the disclosed ranges, voids, cracks, and the like of the electron transport layer 150 may have a large effect on electron transporting capability to decrease device characteristics, and it may be difficult to meet, e.g., obtain, a carrier balance with other constituent elements of the electroluminescent device.

In an embodiment, the electron transport layer 150 may comprise, e.g., consist of, non-light-emitting electron transporting materials that do not emit light by an electric field and electrons may not be quenched internally.

The electron transport layer 150 may include inorganic nanoparticles or may be an organic layer formed by deposition. For example, the electron transport layer 150 may include an inorganic nanoparticle, a quinolone-containing compound, a triazine-containing compound, a quinoline-containing compound, a triazole-containing compound, a naphthalene-containing compounds, or a combination thereof.

In an embodiment, the electron transport layer 150 may include inorganic nanoparticles. The inorganic nanoparticles impart an electron transporting property to the electron transport layer 150 and do not exhibit luminescent properties. In an embodiment, the electron transport layer 150 may include at least two inorganic nanoparticles. In an embodiment, the electron transport layer 150 may include a population layer comprising, e.g., consisting of, at least two inorganic nanoparticles.

An electron injection layer easing injection of electrons, a hole blocking layer blocking movement of holes, or a combination thereof may be further disposed between the electron transport layer 150 and the second electrode 160.

The electron injection layer and the hole blocking layer may have each desirably selected thickness. For example, each thickness may be in a range of greater than or equal to about 1 nm and less than or equal to about 500 nm but is not limited thereto. The electron injection layer may be an organic layer formed through deposition.

The electron injection layer may include for example 1,4,5,8-naphthalene-tetracarboxylic dianhydride (NTCDA), bathocuproine (BCP), tris[3-(3-pyridyl)-mesityl] borane (3TPYMB), LiF, Alq$_3$, Gaq$_3$, Inq$_3$, Znq$_2$, Zn(BTZ)$_2$, BeBq$_2$, ET204 (8-(4-(4,6-di(naphthalen-2-yl)-1,3,5-triazin-2-yl) phenyl)quinolone), 8-hydroxyquinolinato lithium (Liq), an n-type metal oxide (e.g., ZnO, HfO$_2$, etc.), 8-(4-(4,6-di (naphthalen-2-yl)-1,3,5-triazin-2-yl)phenyl)quinolone, bathophenanthroline (Bphen), or a combination thereof, but is not limited thereto.

The hole blocking layer (HBL) may include for example 1,4,5,8-naphthalene-tetracarboxylic dianhydride (NTCDA), bathocuproine (BCP), tris[3-(3-pyridyl)-mesityl] borane (3TPYMB), LiF, Alq$_3$, Gaq3, Inq3, Znq2, Zn(BTZ)$_2$, BeBq$_2$, or a combination thereof, but is not limited thereto.

The electroluminescent device 100 according to an embodiment may include the thermally activated delayed fluorescence material in the hole transport layer 130, the light emitting layer 140, or a combination thereof as described herein. In an embodiment, the thermally activated delayed fluorescence material may transfer excitons to the light emitting layer 140, specifically the quantum dots 141, using a Forster resonance energy-transfer (FRET) phenomenon. Accordingly, in the electroluminescent device according to an embodiment, excess electrons may be recombined with holes, excess electrons present on the interface of the hole transport layer 130 and the light emitting layer 140 or near the interface may be prevented from degrading the hole transport layer 130, and excitons formed inside the hole transport layer 130 may be recycled using the FRET phenomenon. As a result, the electroluminescent device according to an embodiment may exhibit improved life-span and luminous efficiency.

In order that the electroluminescent device exhibits improved life-span and luminous efficiency, the thermally activated delayed fluorescence material may be included in the predetermined amount range, based on 100 wt % of the layer including the thermally activated delayed fluorescence material of the hole transport layer and the light emitting layer, as described herein.

In an embodiment, the predetermined amount range may be for example greater than or equal to about 0.01 wt %, for example greater than or equal to about 0.05 wt %, greater than or equal to about 0.1 wt %, greater than or equal to about 1 wt %, greater than or equal to about 2 wt %, or greater than or equal to about 3 wt %, and for example less than about 10 wt %, less than or equal to about 9 wt %, less than or equal to about 8 wt %, less than or equal to about 7 wt %, less than or equal to about 6 wt %, or less than or equal to about 5 wt %, or for example about 0.01 wt % to about 10 wt %, about 0.05 wt % to about 10 wt %, about 0.1 wt % to about 10 wt %, about 1 wt % to about 10 wt %, about 1 wt % to about 9 wt %, about 1 wt % to 8 wt %, about 1 wt % to 7 wt %, about 1 wt % to 6 wt %, or about 1 wt % to 5 wt %.

When the thermally activated delayed fluorescence material is included in an amount of less than about 0.01 wt %, based on 100 wt % of the layer including the thermally activated delayed fluorescence material of the hole transport layer and the light emitting layer, the optical recycling effect by the thermally activated delayed fluorescence material may be insignificant. When the amount of the thermally activated delayed fluorescence material is greater than about 10 wt %, a portion of light emission by the thermally activated delayed fluorescence material may not follow the FRET phenomenon, and the color purity of the device may be deteriorated by light emission itself.

The thermally activated delayed fluorescence material that may be used in an embodiment is not particularly limited. The thermally activated delayed fluorescence material is capable of optical recycling, for example, realizing, e.g., exhibiting, the Forster resonance energy transfer (FRET) phenomenon with relation to the quantum dots 141.

Specific examples of the thermally activated delayed fluorescence material may be 9'-[4-(4,6-diphenyl-1,3,5-triazin-2-yl)phenyl]-3,3", 6,6"-tetraphenyl-9,3':6',9"-ter-9H-carbazole (BDPCC-TPTA), 2,3,4,6-tetra(9H-carbazol-9-yl)-5-fluorobenzonitrile (4CzFCN), 10,10'-(4,4'-sulfonyl bis(4,1-phenylene)) bis(9,9-dimethyl-9,10-dihydroacridine) (DMAC-DPS), 9'-[4-(4,6-diphenyl-1,3,5-triazin-2-yl)phenyl]-9,3':6',9"-ter-9H-carbazole (BCC-TPTA), 9,9'-(5-(4,6-diphenyl-1,3,5-triazin-2-yl)-1,3-phenylene)bis(9H-carbazole) (DCzTrz), 9,9',9",9"'-((6-phenyl-1,3,5-triazine-2,4-diyl)bis(benzene-5,3,1-triyl))tetrakis (9H-carbazole) (DDCzTrz), 9,9'-(4,4'-sulfonylbis(4,1-phenylene))bis(3,6-di-tert-butyl-9H-carbazole) (CZ-PS), 10,10'-(4,4'-(4-phenyl-4H-1,2,4-triazole-3,5-diyl)bis(4,1-phenylene))bis(10H-phenoxazine) (2PXZ-TAZ), or a combination thereof, but is not necessarily limited thereto.

In an embodiment, the thermally activated delayed fluorescence material may have a predetermined HOMO (highest occupied molecular orbital) energy level and LUMO (lowest unoccupied molecular orbital) energy level and implementation of the FRET phenomenon may be facilitated.

For example, the thermally activated delayed fluorescence material may have a HOMO energy level of about −6.1 eV to about −5.2 eV, for example about −5.8 eV to about −5.5 eV.

For example, the thermally activated delayed fluorescence material may have a LUMO energy level of about −3.6 eV to about −2.0 eV, for example about −3.2 eV to about −2.4 eV.

In an embodiment, when the HOMO energy level, LUMO energy level, or a combination thereof of the thermally activated delayed fluorescence material is outside of the disclosed range, differences in energy level from, e.g., of, the material having the hole transporting property, the quantum dots 141, or a combination thereof may become large, and a conduction band of the thermally activated delayed fluorescence material, which may act as an energy trap, may be deepened.

Differences in the HOMO (highest occupied molecular orbital) energy level of the thermally activated delayed fluorescence material from, e.g., and between, the material having the hole transporting property, the quantum dots, or a combination thereof may be adjusted within a predetermined range, and the thermally activated delayed fluorescence material may implement, e.g., provide for, the aforementioned FRET phenomenon.

For example, when the hole transport layer 130 includes the thermally activated delayed fluorescence material and the material having the hole transporting property, a difference between the HOMO energy level of the thermally activated delayed fluorescence material and the HOMO energy level of the material having the hole transporting property may be for example about −1.0 eV to about 1.0 eV, for example about −0.5 eV to about 0.5 eV.

For example, when the light emitting layer 140 includes the thermally activated delayed fluorescence material, a difference between the HOMO (highest occupied molecular orbital) energy level of the thermally activated delayed fluorescence material and the HOMO energy level of the quantum dots 141 may be for example about −1.0 eV to about 1.0 eV, for example about −0.5 eV to about 0.5 eV.

In an embodiment, differences between HOMO energy levels of the thermally activated delayed fluorescence material and the material having the hole transporting property, the quantum dots, or a combination thereof are outside of a range of about −1.0 eV to about 1.0 eV, differences between the energy levels of the material having the hole transporting property, the quantum dots, or a combination thereof 141 may become large, and the conduction band of the thermally activated delayed fluorescence material may act as an energy trap.

In an embodiment, the thermally activated delayed fluorescence material may have a predetermined emission wavelength spectrum to better exhibit the FRET phenomenon in relationship with adjacent quantum dots 141. The emission wavelength spectrum of the thermally activated delayed fluorescence material may be varied according to the emission wavelength spectrum of the adjacent quantum dots 141.

Hereinafter, various arrangement relations of the thermally activated delayed fluorescence material in the electroluminescent device will be described with reference to FIGS. 2 to 5 in addition to the aforementioned FIG. 1.

Figure 2:
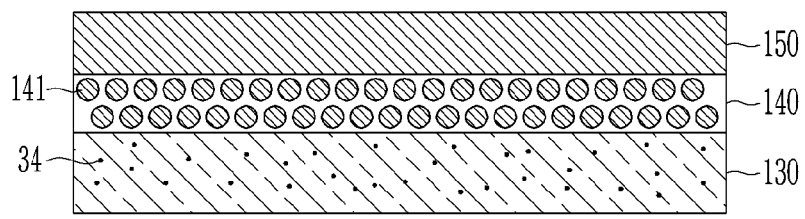
FIG. 2 illustrates an embodiment of the thermally activated delayed fluorescence material in the electroluminescent device according to an embodiment.
Figure 3:
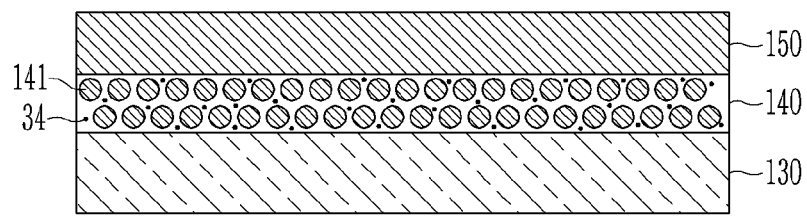
FIG. 3 illustrates an embodiment of the thermally activated delayed fluorescence material in the electroluminescent device according to an embodiment.
Figure 4:
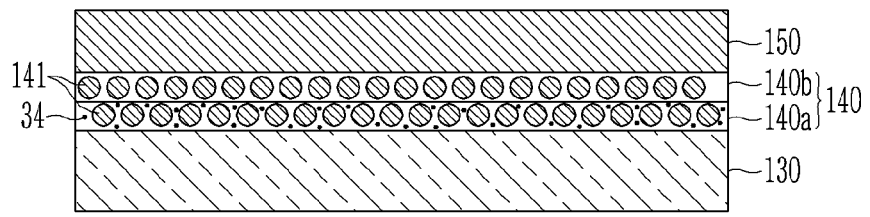
FIG. 4 illustrates an embodiment of the thermally activated delayed fluorescence material in the electroluminescent device according to an embodiment.
Figure 5:
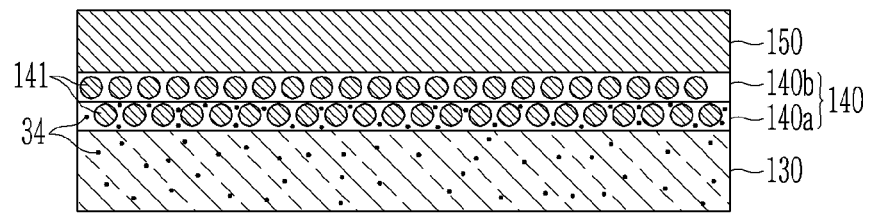
FIG. 5 illustrates an embodiment of the thermally activated delayed fluorescence material in the electroluminescent device according to an embodiment.

FIG. 2 illustrates an embodiment of the thermally activated delayed fluorescence material in the electroluminescent device according to an embodiment. FIG. 3 illustrates an embodiment of the thermally activated delayed fluorescence material in the electroluminescent device according to an embodiment. FIG. 4 illustrates an embodiment of the thermally activated delayed fluorescence material in the electroluminescent device according to an embodiment. FIG. 5 illustrates an embodiment of the thermally activated delayed fluorescence material in the electroluminescent device according to an embodiment.

FIGS. 2 to 5 illustrate the thermally activated delayed fluorescence material in the form of black dots for convenience to indicate the presence of the thermally activated delayed fluorescent material. However, this is merely an expression for aiding an understanding of the presence of the thermally activated delayed fluorescent material, and the specific shape of the thermally activated delayed fluorescent material is not limited as shown in FIGS. 2 to 5.

Referring to FIG. 2, the hole transport layer 130 and the light emitting layer 140 are in contact with, e.g., directly on, each other, and the thermally activated delayed fluorescence material 34 may be included in the hole transport layer 130 of the electroluminescent device. The thermally activated delayed fluorescence material 34 may be dispersed in the hole transport layer 130 as shown in FIG. 2. The distribution pattern of the thermally activated delayed fluorescence material 34 in the hole transport layer 130 may be variously controlled by controlling the formation process of the hole transport layer 130.

For example, a composition for forming the hole transport layer including the thermally activated delayed fluorescence material 34, the material having the hole transporting property, a binder, a solvent, and the like may be stirred uniformly and the thermally activated delayed fluorescence material 34 may be evenly dispersed in the hole transport layer 130 during the hole transport layer formation process.

By applying the composition for forming the hole transport layer including the thermally activated delayed fluorescence material 34, the material having the hole transporting property, a binder, a solvent, and the like, and then applying the composition including the thermally activated delayed fluorescence material 34 thereon to cure together, a concentration gradient of the thermally activated delayed fluorescence material 34 may be adjusted to be higher, e.g., greater, in a direction toward the surface of the light emitting layer 140.

Referring to FIG. 3, the thermally activated delayed fluorescence material 34 may be included in the light emitting layer 140 of the electroluminescent device. The thermally activated delayed fluorescence material 34 may be dispersed in the light emitting layer 140 together with the quantum dots 141.

The distribution pattern of the thermally activated delayed fluorescence material 34 in the light emitting layer 140 may vary depending on the number of stacked layers (e.g., a single layer or two or more layers), the thickness, and the like of the light emitting layer 140.

For example, the light emitting layer may be formed of a dual light emitting layer including a first layer adjacent to, e.g., directly on, the hole transport layer and a second layer disposed between the first layer and the electron transport layer.

In an embodiment, each of the first layer and the second layer may emit a first light belonging to a same predetermined wavelength region. The first light may belong to a first wavelength region of about 380 nm to about 488 nm, a second wavelength region of about 490 nm to about 510 nm, a third wavelength region of about 511 nm to about 580 nm, a fourth wavelength region of about 582 nm to about 600 nm, or a fifth wavelength region of about 620 nm to about 680 nm.

In an embodiment, each of the first and second layers may have a thickness of for example greater than or equal to about 1 nm, greater than or equal to about 2 nm, or greater than or equal to about 5 nm, and for example less than or equal to about 30 nm, less than or equal to about 25 nm, less than or equal to about 20 nm, or less than or equal to about 15 nm, for example about 1 nm to about 30 nm, about 2 nm to about 30 nm, about 5 nm to about 30 nm, about 5 nm to about 25 nm, or about 5 nm to about 20 nm.

In an embodiment, the second layer may have a thickness less than or equal to a thickness of the first layer. For example, as a method for further improving optical recycling through the FRET phenomenon, the thickness of the second layer may be adjusted to be less than or equal to the thickness of the first layer.

In an embodiment, an amount of the thermally activated delayed fluorescence material included in the first layer may be higher, e.g., greater, than an amount of the thermally activated delayed fluorescence material included in the second layer. In an embodiment, the second layer may be substantially free of the thermally activated delayed fluorescence material. As used herein, "substantially free" may mean about 0 weight percent to about 0.005 weight percent, 0 weight percent to about 0.001 weight percent, 0 weight percent to about 0.0005 weight percent, or 0 weight percent to about 0.0001 weight percent, based on 100 weight percent of the second layer.

The distribution pattern, amount, or a combination thereof of the thermally activated delayed fluorescence material 34 in the dual light emitting layer structure may be variously controlled by controlling the formation process of the first layer and the second layer. For example, a composition for forming the first layer including the quantum dots 141, the thermally activated delayed fluorescence material 34, a light diffusing agent (for example, e.g., TiO$_2$, SiO$_2$, etc.), a binder, a solvent, and the like is coated on the hole transport layer 130 and subsequently, a composition for forming a second layer including less thermally activated delayed fluorescence material 34 compared with the composition for forming the first layer is coated thereon, and thereby an amount of the thermally activated delayed fluorescence material 34 of the first and second layers may be adjusted, and a degree of dispersion of the thermally activated delayed fluorescence material 34 may be adjusted by an agitation degree of each composition before forming the first layer, the second layer, or a combination thereof. In an embodiment, the thermally activated delayed fluorescence material 34 is even included in the first layer 140a and not in the second layer 140b as shown in FIG. 4.

According to FIG. 5, in the electroluminescent device according to the embodiment, the light emitting layer 140 includes the first layer 140a and the second layer 140b, and the thermally activated delayed fluorescence material 34 may be dispersed in each of the first layer 140a and the hole transport layer 130.

The thermally activated delayed fluorescence material 34 in the electroluminescent device according to the embodiment may have various arrangement relations in the hole transport layer 130, the light emitting layer 140, or a combination thereof as shown in FIGS. 2 to 5. However, the arrangement relationship of the thermally activated delayed fluorescence material 34 is not necessarily limited to those shown in FIGS. 2 to 5.

As described herein, the electroluminescent device according to the embodiment may perform optical recycling through the FRET phenomenon by variously disposing the thermally activated delayed fluorescence material in the hole transport layer 130, the light emitting layer 140, or a combination thereof, degradation of the hole transport layer 130 by the excess electrons may be decreased or minimized, and thus charge uniformity of the device may be maintained (an increase in resistance may be suppressed while driving the device), exhibiting improved life characteristics.

Hereinafter, a display device including the electroluminescent device 10 is described.

A display device according to an embodiment includes a substrate, a driving circuit formed on the substrate, and a first electroluminescent device, a second electroluminescent device, and a third electroluminescent device spaced apart from each other in a predetermined interval and disposed on the driving circuit.

The first to third electroluminescent devices have the same structure as the electroluminescent device 10 and but the wavelengths of the lights emitted from each quantum dots may be different from each other.

In an embodiment, the first electroluminescent device is a red device emitting red light, the second electroluminescent device is a green device emitting green light, and the third electroluminescent device is a blue device emitting blue light. In other words, the first to third electroluminescent devices may be pixels expressing red, green, and blue, respectively, in the display device.

However, an embodiment is not necessarily limited thereto, but the first to third electroluminescent devices may respectively express magenta, yellow, cyan, or may express other colors.

One of the first to third electroluminescent devices may be the electroluminescent device 10. In this case, the third electroluminescent device displaying at least blue may be desirably the electroluminescent device 10.

In the display device according to an embodiment, a hole injection layer, a hole transport layer, an electron transport layer, an electron injection layer, and a hole blocking layer except a light emitting layer of each pixel may be integrated to form a common layer. However, an embodiment is not limited thereto. A hole injection layer, a hole transport layer, an electron transport layer, an electron injection layer, and a hole blocking layer may be independently formed in each pixel of the display device, or a hole injection layer, a hole transport layer, an electron transport layer, an electron injection layer, a hole blocking layer, or a combination thereof may form a common layer and remaining layers may form a separate independent layer.

The substrate may be a transparent insulating substrate or may be made of a ductile material. The substrate may include glass or a polymer material in a film having a glass transition temperature (Tg) of greater than about 150° C. For example, the substrate may include a COC (cycloolefin copolymer) or COP (cycloolefin polymer) based material. The first to third electroluminescent devices may be formed on the substrate. That is, a substrate of the display device according to an embodiment may provide a common layer.

The driving circuit is disposed on the substrate and is independently connected to each of the first to third electroluminescent devices. The driving circuit may include at least one line including a scan line, a data line, a driving power source line, a common power source line, and the like, at least two of thin film transistors (TFT) connected to the wire and corresponding to one organic light emitting diode, and at least one capacitor, or the like. The driving circuit may have a variety of structures.

As described herein, a display device according to an embodiment may exhibit improved device efficiency and thus improved life-span and luminous efficiency.

Hereinafter, the embodiments are illustrated in more detail with reference to examples. These examples, however, are not in any sense to be interpreted as limiting the scope of the invention.

EXAMPLES

Example 1

A glass substrate deposited with indium tin oxide (ITO) (a work function: −4.850 electronvolts (eV)) as a first electrode (an anode) is surface-treated with ultraviolet (UV)-ozone for 15 minutes and then, spin-coated with a poly(3,4-ethylene-dioxythiophene)-poly(styrenesulfonate) (PEDOT:PSS) solution (H.C. Starks) and heat-treated at 150° C. 30 minutes under a nitrogen atmosphere to form a 30 nanometer (nm)-thick hole injection layer.

In addition, 9'-[4-(4,6-diphenyl-1,3,5-triazin-2-yl)phenyl]-3,3",6,6"-tetraphenyl-9,3':6',9"-ter-9H-carbazole (BDPCC-TPTA, a peak emission wavelength: 463 nm, an HOMO energy level: −5.21 eV, a LUMO energy) level: −2.11 eV, Lumtec Corp.) as a thermally activated delayed fluorescence material is dispersed at a concentration of 0.1 weight percent (wt %) in xylene to prepare dispersion and then, mixed with a solution prepared by dissolving 1.0 wt % of poly[(9,9-dioctylfluorenyl-2,7-diyl-co(4,4'-(N-4-butylphenyl)diphenylamine] (TFB, an HOMO energy level: −5.56 eV, a LUMO energy level: −2.69 eV, Sumitomo Corp.) in xylene in a volume ratio of 1:4 (BDPCC-TPTA: TFB) to prepare a solution for a hole transport layer.

Subsequently, the solution for a hole transport layer is spin-coated on the hole injection layer and heat-treated at 150° C. for 30 minutes to form a 25 nm-thick hole transport layer (a content of BDPCC-TPTA in the hole transport layer: 0.1 to 1.0 wt %).

Subsequently, $5 \times 10^{-5}$ millimoles (mmol) of an InP/ZnSe/ZnS core-double shell quantum dot to which oleic acid as a hydrophobic ligand is attached on the surface (an average particle diameter: 9 nm, a peak wavelength: 632 nm, an HOMO energy level: −5.6 eV, a LUMO energy level: −3.61 eV) is added to 10 milliliters (mL) of octane and then, stirred for 5 minutes to prepare a composition for a light emitting layer. Then, the composition for a light emitting layer is spin-coated on the hole transport layer and heat-treated at 120° C. for 30 minutes under a nitrogen atmosphere to form a 20 nm-thick light emitting layer.

On the light emitting layer, a solution for an electron transport layer is prepared by dispersing ZnMgO (an HOMO energy level: −7.7 eV, a LUMO energy level: −4.3 eV) in ethanol and then, spin-coated and heat-treated at 80° C. for 30 minutes to form an electron transport layer having an average thickness of 40 nm.

On the electron transport layer, aluminum (a work function: −4.3 eV) is vacuum-deposited to form a 100 nm-thick second electrode and thus manufacture an electroluminescent device of Example 1.

Example 2

An electroluminescent device of Example 2 is manufactured according to the same method as Example 1 except that 2,3,4,6-tetra(9H-carbazol-9-yl)-5-fluorobenzonitrile (4CzFCN, a peak emission wavelength: 472 nm, a HOMO energy level: −5.95 eV, a LUMO energy level: −3.10 eV, Lumtec Corp.) is used instead of BDPCC-T PTA as a thermally activated delayed fluorescence material (a content of 4CzFCN in the hole transport layer: 0.1 to 1.0 wt %).

Example 3

A glass substrate deposited with ITO (a work function: −4.850 eV) as a first electrode (an anode) is surface-treated with UV-ozone for 15 minutes, and a PEDOT:PSS solution (H.C. Starks) is spin-coated and heat-treated at 150° C. for 30 minutes under a nitrogen atmosphere to form a 30 nm-thick hole injection layer.

In addition, 1.0 wt % of a hole transport material induced from TFB (YGHT720, an HOMO energy level: −5.54 eV, a LUMO energy level: −2.46 eV) is dissolved in xylene to prepare a solution for a hole transport layer. Subsequently, the solution for a hole transport layer is spin-coated on the hole injection layer and then, heat-treated at 150° C. for 30 minutes to form a 25 nm-thick hole transport layer.

Subsequently, a composition for a light emitting layer is prepared by dispersing 9'-[4-(4,6-diphenyl-1,3,5-triazin-2-yl)phenyl]-3,3'',6,6''-tetraphenyl-9,3 6',9''-ter-9H-carbazole (BDPCC-TPTA, a peak emission wavelength: 463 nm, an HOMO energy level: −5.21 eV, a LUMO energy level: −2.11 eV, Lumtec Corp.) as a thermally activated delayed fluorescence material at a concentration of 0.1 wt % in xylene and dispersing 0.1 to 0.2 wt % of an InP/ZnSe/ZnS core-double shell quantum dot to which oleic acid as a hydrophobic ligand is attached on the surface (an average particle diameter: 9 nm, a peak wavelength: 632 nm, an HOMO energy level: −5.6 eV, a LUMO energy level: −3.61 eV) in octane and then, mixing them in a volume ratio of 1:4 (BDPCC-TPTA:quantum dot). Subsequently, the composition for a light emitting layer is spin-coated on the hole transport layer and then, heat-treated at 120° C. for 30 minutes under a nitrogen atmosphere to form a 20 nm-thick light emitting layer. (a content of BDPCC-T PTA in the light emitting layer: 0.1 to 1.0 wt %).

On the light emitting layer, a solution for an electron transport layer which is prepared by dispersing ZnMgO (an HOMO energy level: −7.7 eV, a LUMO energy level: −4.3 eV) in ethanol and then, spin-coated and heat-treated at 80° C. for 30 minutes to form an electron transport layer having an average thickness of 40 nm.

On the electron transport layer, aluminum (a work function: −4.3 eV) is vacuum-deposited to be 100 nm thick to form a second electrode and thus manufacture an electroluminescent device of Example 3.

Example 4

An electroluminescent device of Example 4 is manufactured according to the same method as Example 1 except that 2,3,4,6-tetra(9H-carbazol-9-yl)-5-fluorobenzonitrile (4CzFCN, a peak emission wavelength: 472 nm, an HOMO energy level: −5.95 eV, a LUMO energy level: −3.10 eV, Lumtec Corp.) as a thermally activated delayed fluorescence material is used instead of BDPCC-TPTA (a content of 4CzFCN in the hole transport layer: 0.1 to 1.0 wt %).

Example 5

An electroluminescent device of Example 5 is manufactured according to the same method as Example 4 except that chloroform ($CHCl_3$) is used as a solvent used to prepare the solution for a hole transport layer, and the content of 4CzFCN in the hole transport layer is reduced (the content of 4CzFCN in the hole transport layer: 0.1 to 1.0 wt %).

Example 6

A glass substrate deposited with ITO (a work function: −4.850 eV) is surface-treated with UV-ozone for 15 minutes as a first electrode (an anode), and then, a PEDOT:PSS solution (H.C. Starks) is spin-coated and heat-treated at 150° C. for 30 minutes under a nitrogen atmosphere to form a 30 nm-thick hole injection layer.

In addition, 1.0 wt % of a hole transport material induced from TFB (YGHT720, an HOMO energy level: −5.54 eV, a LUMO energy level: −2.46 eV) is dissolved in xylene to prepare a solution for a hole transport layer. Subsequently, the solution for a hole transport layer is spin-coated on the hole injection layer and then, heat-treated at 150° C. for 30 minutes to form a 25 nm-thick hole transport layer.

The composition for a first layer (a first light emitting layer) is prepared by dispersing 9'-[4-(4,6-diphenyl-1,3,5-triazin-2-yl)phenyl]-3,3'',6,6''-tetraphenyl-9,3': 6',9''-ter-9H-carbazole (BDPCC-TPTA, a peak emission wavelength: 463 nm, an HOMO energy level: −5.21 eV, a LUMO energy level: −2.11 eV, Lumtec Corp.) as a thermally activated delayed fluorescence material at a concentration of 0.1 wt % in xylene and dispersing 0.1 to 0.2 wt % of an InP/ZnSe/ZnS core-double shell quantum dot to which oleic acid as a hydrophobic ligand is attached on the surface (an average particle diameter: 9 nm, a peak wavelength: 632 nm, an HOMO energy level: −5.6 eV, a LUMO energy level: −3.61 eV) in octane and then, mixing them in a volume ratio of 1:4 (BDPCC-TPTA:quantum dot). Subsequently, the composition for a first layer is spin-coated on the hole transport layer and then, heat-treated at 120° C. for 30 minutes under a nitrogen atmosphere to form a 13 nm-thick first layer. (a content of BDPCC-TPTA in the first layer: 0.1 to 1.0 wt %).

In addition, $5 \times 10^{-5}$ mmol of an InP/ZnSe/ZnS core-double shell quantum dot to which oleic acid as a hydrophobic ligand is attached (an average particle diameter: 9 nm, a peak wavelength: 632 nm, an HOMO energy level: −5.6 eV, a LUMO energy level: −3.61 eV) is added to 10 mL of octane and then, stirred for 5 minutes to prepare a composition for a second layer (a second light emitting layer). Subsequently, the composition for a second layer is spin-coated on the first layer and then, heat-treated at 120° C. for 30 minutes under a nitrogen atmosphere to form a 13 nm-thick second layer.

On the second layer, a solution for an electron transport layer is prepared by dispersing ZnMgO (an HOMO energy level: −7.7 eV, a LUMO energy level: −4.3 eV) in ethanol and then, spin-coated and heat-treated at 80° C. for 30 minutes to form an electron transport layer having an average thickness of 40 nm.

On the electron transport layer, aluminum (a work function: −4.3 eV) is vacuum-deposited to be 100 nm thick to form a second electrode and thus manufacture an electroluminescent device of Example 6.

Comparative Example 1

An electroluminescent device of Comparative Example 1 is manufactured according to the same method as Example 1 except that a solution for a hole transport layer including no thermally activated delayed fluorescence material is used.

Comparative Example 2

An electroluminescent device of Comparative Example 2 is manufactured according to the same method as Example 3 except that a composition for a light emitting layer including no thermally activated delayed fluorescence material is used.

Comparative Example 3

An electroluminescent device of Comparative Example 3 is manufactured according to the same method as Example 4 except that chloroform is used as a solvent in the solution for a hole transport layer, and the content of 4CzFCN in the hole transport layer is increased (the content of 4CzFCN in the hole transport layer: 10 wt %).

Comparative Example 4

An electroluminescent device of Comparative Example 4 is manufactured according to the same method as Comparative Example 1 except that the thickness of the light emitting layer thickness is adjusted to be 26 nm and thus corresponds the entire thickness (the first layer thickness+the second layer thickness) of the light emitting layer of Example 6.

Evaluation 1: Light Emitting and Life-span Characteristics of Electroluminescent Device Including Thermally Activated Delayed Fluorescence Material in Hole Transport Layer The electroluminescent devices of Examples 1 to 2 and Comparative Example 1 are measured with respect to luminescence properties, and the results are respectively shown in Table 1 and FIG. 6.

thermally activated delayed fluorescence material is included in the hole transport layer as shown in Examples, there is almost no influence on peaks, full widths at half maximum (FWHM), and color coordinates of spectra.

Figure 6:
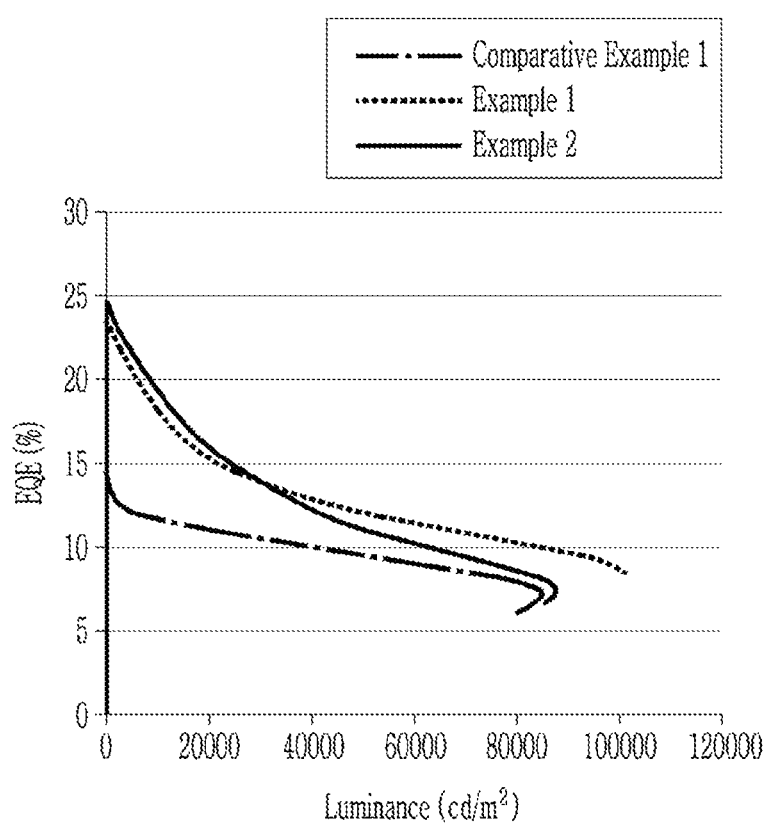
FIG. 6 is a graph of external quantum efficiency (EQE) (percent (%)) versus luminance (candelas per square meter ($cd/m^2$)) of the electroluminescent devices of Examples 1 to 2 and Comparative Example 1.

Accordingly, referring to the results of Table 1 and FIG. 6, Examples including the thermally activated delayed fluorescence material in the hole transport layer exhibit excellent luminous efficiency compared with Comparative Example 1.

Figure 7:
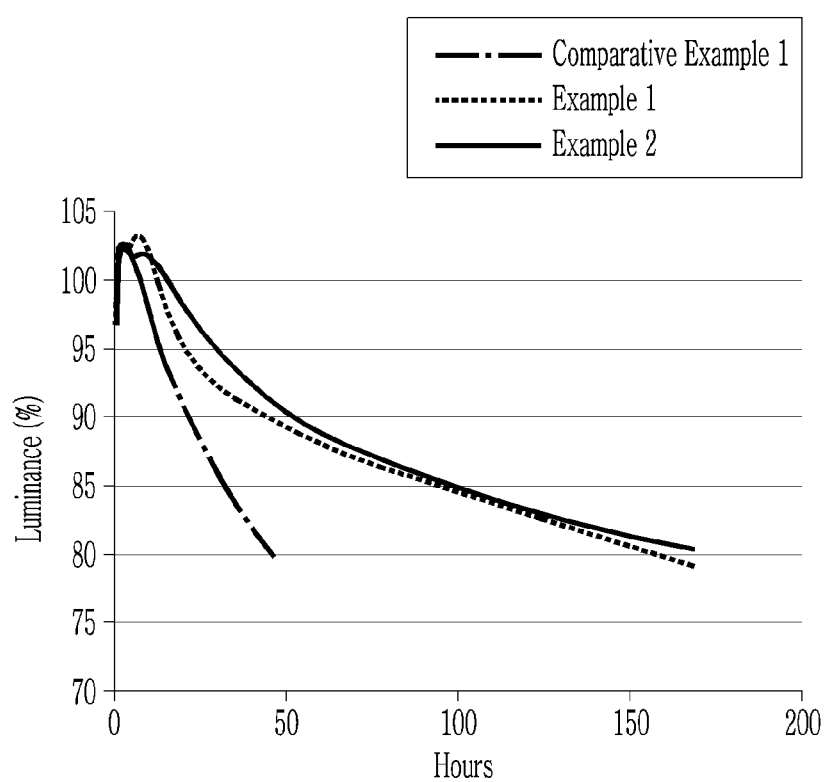
FIG. 7 is a graph of luminance (%) versus hours of the electroluminescent devices of Example 1 to 2 and Comparative Example 1.
Figure 8:
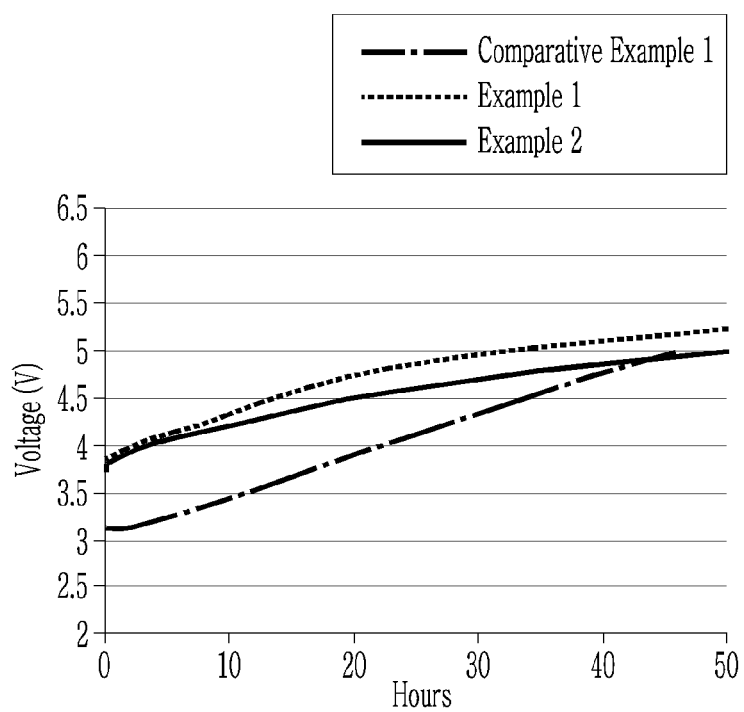
FIG. 8 is a graph of voltage (volts (V)) versus hours of the electroluminescent devices of Examples 1 to 2 and Comparative Example 1.

The electroluminescent devices of Examples 1 to 2 and Comparative Example 1 are measured with respect to time-device luminance (a relative value) and time-driving voltage, and the results are respectively shown in Table 2 and FIGS. 7 to 8.

TABLE 2

|  | T95 (hours (h)) | T80 (h) | Injection current (milliamperes (mA)) | Initial luminance (nits) | Initial driving voltage (①) (V) | Driving voltage @ 45 h (②) (V) | $\Delta V$ (= ② − ①) (V) |
|---|---|---|---|---|---|---|---|
| Ex. 1 | 20.12 | 168 | 0.299 | 1,500 | 3.9 | 5.2 | 1.3 |
| Ex. 2 | 29.81 | 168 | 0.271 | 1,500 | 3.7 | 4.93 | 1.23 |
| Comp. Ex. 1 | 13.28 | 45.2 | 0.272 | 1,500 | 3.1 | 4.96 | 1.86 |

FIG. 7 is a graph showing time-device luminance (a relative value) characteristics of the electroluminescent devices of Example 1 to 2 and Comparative Example 1, and FIG. 8 is a graph showing changes in driving voltages over time of the electroluminescent devices of Examples 1 to 2 and Comparative Example 1. In Table 2, T95 and T80 refer to respectively times when 95% of luminance (T95) relative to initial luminance (e.g., 4,500 nits) and 80% of luminance (T80) relative to initial luminance are obtained.

Referring to Table 2 and FIGS. 7 to 8, Examples exhibit greatly high T95 and T80 and a low driving voltage change depending on a time change compared with Comparative Example 1

Accordingly, referring to the results of Table 2 and FIGS. 7 to 8, Examples including the thermally activated delayed fluorescence material in the hole transport layer exhibit excellent life-span characteristics and delayed degradation of the hole transport layer about excess electrons compared with Comparative Example 1.

TABLE 1

|  | Maximum EQE (percent (%)) | Maximum luminance (candelas per square meter (cd/m²)) | EQE @ 10,000 nits (%) | Maximum current efficiency (candelas per ampere (cd/A)) | Driving voltage @ 5 milliamperes per square centimeter (mA/cm²) (volts(V)) | Luminance @ 5 mA/cm² (cd/m²) | Driving voltage @ 1,000 nits (V) | Peak emission wave-length (nm) | Full width at half maximum (FWHM) (nm) | CIE x | CIE y |
|---|---|---|---|---|---|---|---|---|---|---|---|
| Ex. 1 | 23.4 | 100,800 | 18.3 | 25.5 | 2.9 | 1250 | 2.8 | 632 | 35 | 0.691 | 0.3071 |
| Ex. 2 | 24.5 | 87,530 | 19.3 | 26.7 | 3.2 | 1314 | 3.1 | 631 | 36 | 0.691 | 0.3075 |
| Comp. Ex. 1 | 13.9 | 85,180 | 11.7 | 15.1 | 2.7 | 737 | 2.8 | 632 | 35 | 0.6912 | 0.308 |

FIG. 6 is a graph showing luminance-external quantum efficiency (EQE) relationships of electroluminescent devices of Examples 1 to 2 and Comparative Example 1. Referring to Table 1 and FIG. 6, Examples 1 to 2 exhibit high EQE and luminance and for example, very high EQE at luminance of less than or equal to about 20,000 cd/m², compared with Comparative Example 1 including no thermally activated delayed fluorescence material. In addition, even though the Evaluation 2: Light Emitting and Life-span Characteristics of Electroluminescent Device Including Thermally Activated Delayed Fluorescence Material in Light Emitting Layer The electroluminescent devices of Examples 3 to 4 and Comparative Example 2 are measured with respect to luminescence properties, and the results are shown in Table 3 and FIG. 9.

TABLE 3

| | Maximum EQE (%) | Maximum luminance (cd/m$^2$) | EQE @ 10,000 nits (%) | Maximum current efficiency (cd/A) | Driving voltage @ 5 mA/cm$^2$ (V) | Luminance @ 5 mA/cm$^2$ (cd/m$^2$) | Driving voltage @ 1,000 nits (V) | Peak emission wavelength (nm) | Full width at half maximum (FWHM) (nm) | CIE x | CIE y |
|---|---|---|---|---|---|---|---|---|---|---|---|
| Ex. 3 | 16.2 | 114,930 | 14.3 | 18.5 | 2.8 | 920 | 2.8 | 631 | 35 | 0.6899 | 0.3101 |
| Ex. 4 | 15.9 | 122,040 | 14.5 | 18.3 | 2.8 | 903 | 2.8 | 630 | 35 | 0.689 | 0.31 |
| Comp. Ex. 2 | 17.1 | 100,990 | 13.8 | 18.8 | 3 | 938 | 3 | 632 | 35 | 0.692 | 0.3079 |

Figure 9:
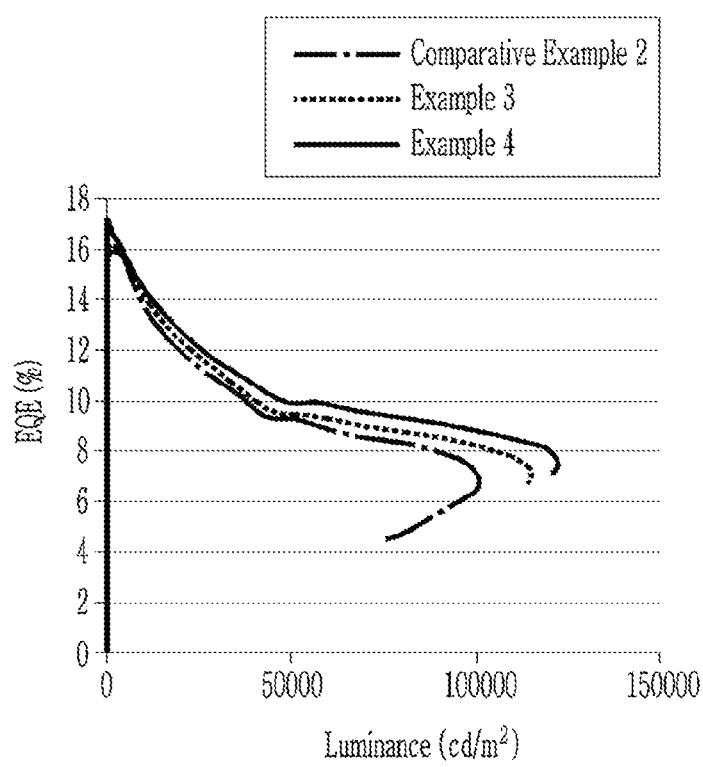
FIG. 9 is a graph of EQE (%) versus luminance ($cd/m^2$) of the electroluminescent devices of Examples 3 to 4 and Comparative Example 2.

FIG. 9 is a graph showing luminance-external quantum efficiency (EQE) relationships of electroluminescent devices of Examples 3 to 4 and Comparative Example 2. Referring to Table 1 and FIG. 6, Examples exhibit a little high EQE and luminance compared with Comparative Example 2 including no thermally activated delayed fluorescence material, but even though the thermally activated delayed fluorescence material is included in the light emitting layer, there is almost no influence on peaks, full widths at half maximum (FWHM), or color coordinates of the emission spectra.

Accordingly, referring to the results of Table 1 and FIG. 6, examples including the thermally activated delayed fluorescence material in the light emitting layers exhibit excellent life-span characteristics and in addition, delayed degradation of the hole transport layer by excess electrons, compared with Comparative Example 2.

Evaluation 3: Light Emitting and Life-span Characteristics of Electroluminescent Device Including Thermally Activated Delayed Fluorescence Material in Different Amounts The luminescence properties of the electroluminescent devices of Example 5 and Comparative Example 3 are measured, and the results are shown in Table 5 and FIG. 12.

TABLE 5

| | Maximum EQE (%) | Maximum luminance (cd/m$^2$) | EQE @ 10,000 nits (%) | Maximum current efficiency (cd/A) | Driving voltage @ 5 mA/cm$^2$ (V) | Luminance @ 5 mA/cm$^2$ (cd/m$^2$) | Driving voltage @ 1,000 nits (V) | Peak emission wavelength (nm) | Full width at half maximum (FWHM) (nm) | CIE x | CIE y |
|---|---|---|---|---|---|---|---|---|---|---|---|
| Ex. 5 | 24.5 | 87,530 | 19.3 | 26.7 | 3.2 | 1314 | 3.1 | 631 | 36 | 0.691 | 0.308 |
| Comp. Ex. 3 | 13 | 60,660 | 9.6 | 14.3 | 2.6 | 703 | 2.6 | 631 | 35 | 0.691 | 0.308 | rescence material in the light emitting layers exhibit a little excellent luminous efficiency compared with Comparative Example 2.

The electroluminescent devices of Examples 3 to 4 and Comparative Example 2 are measured with respect to time-device luminance (a relative value) and time-driving voltage, and the results are respectively shown in Table 2 and FIGS. 7 to 8.

TABLE 4

| | T95 (h) | Injection current (mA) | Initial luminance (nits) | Initial driving voltage (V) |
|---|---|---|---|---|
| Ex. 3 | 57.67 | 0.848 | 4,500 | 3.1 |
| Ex. 4 | 61.3 | 0.854 | 4,500 | 3.2 |
| Comp. Ex. 2 | 7.42 | 0.848 | 4,500 | 3.2 |

Figure 10:
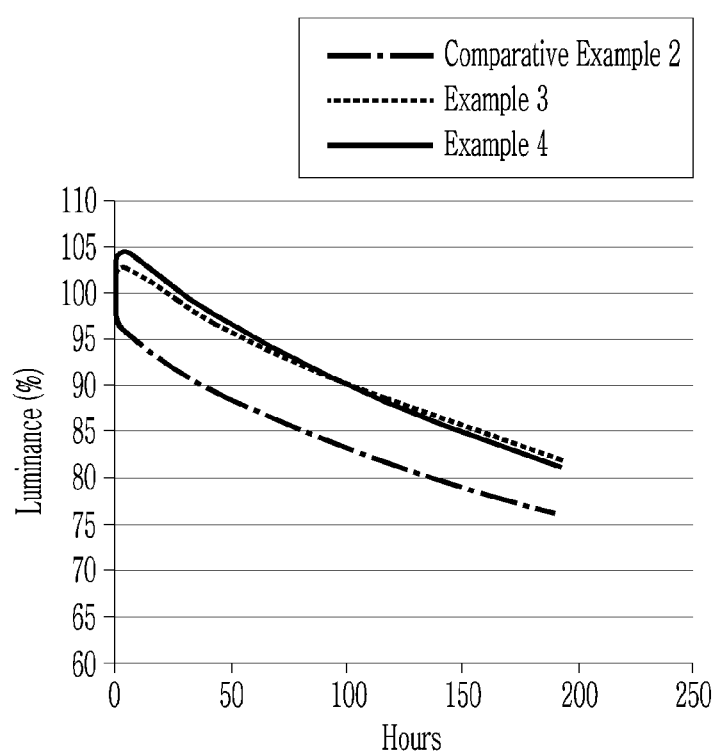
FIG. 10 is a graph of luminance (%) versus hours of the electroluminescent devices of Examples 3 to 4 and Comparative Example 2.
Figure 11:
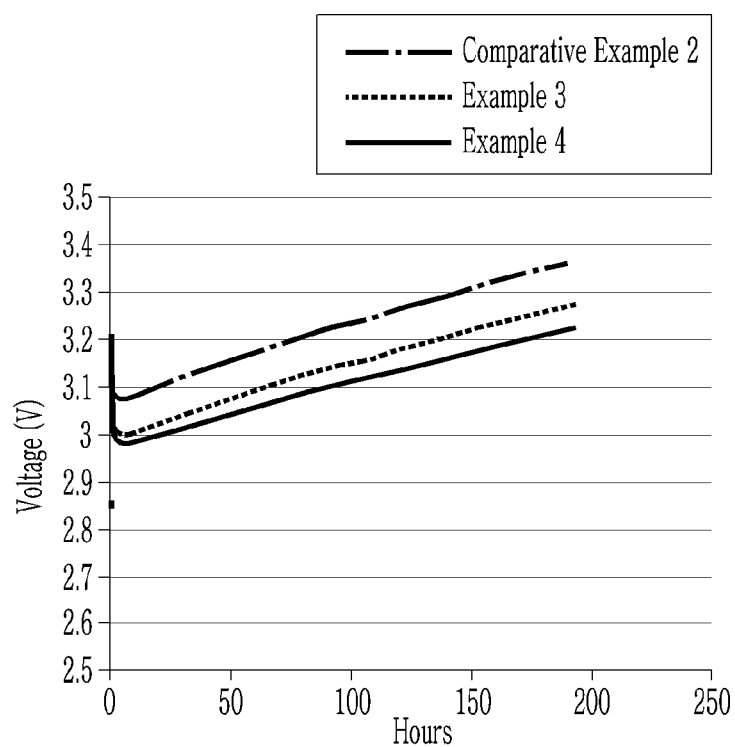
FIG. 11 is a graph of voltage (V) versus hours of the electroluminescent devices of Examples 3 to 4 and Comparative Example 2.

FIG. 10 is a graph showing time-device luminance (a relative value) of the electroluminescent devices of Examples 3 to 4 and Comparative Example 2, and FIG. 11 is a graph showing time-driving voltage of the electroluminescent devices of Examples 3 to 4 and Comparative Example 2. Referring to Table 4 and FIGS. 10 to 11, examples exhibit greatly high T95 and in addition, an evidently low driving voltage change depending on a time change compared with Comparative Example 2.

Figure 12:
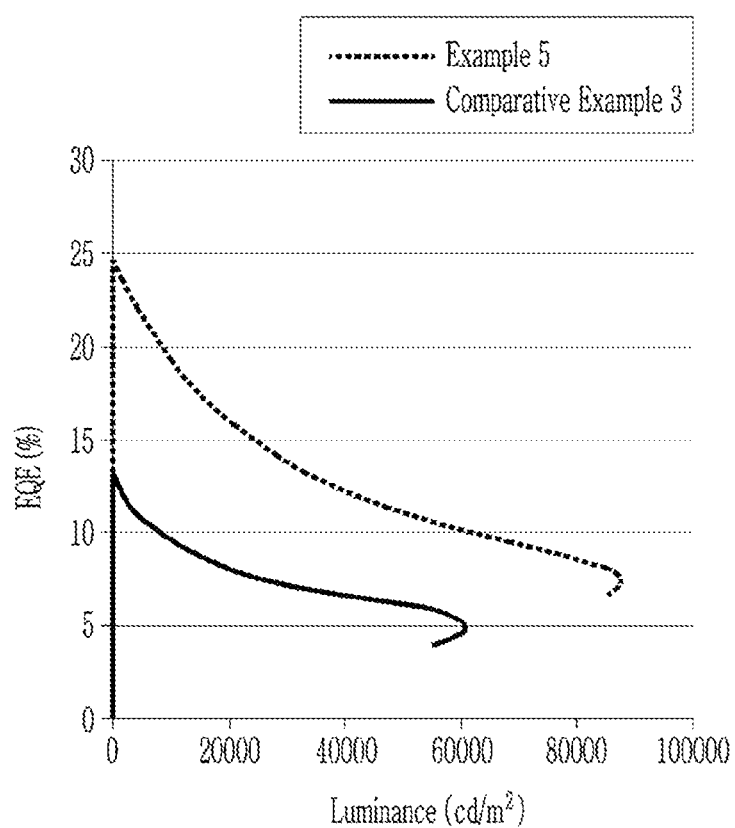
FIG. 12 is a graph of EQE (%) versus luminance ($cd/m^2$) of the electroluminescent devices of Example 5 and Comparative Example 3.

Accordingly, referring to the results of Table 2 and FIGS. 7 to 8, examples including the thermally activated delayed FIG. 12 is a graph showing luminance-external quantum efficiency relationships of the electroluminescent devices of Example 5 and Comparative Example 3. Referring to Table 5 and FIG. 12, Example 5 including 0.1 to 1.0 wt % of the thermally activated delayed fluorescence material exhibits high EQE and luminance compared with Comparative Example 3 including 10 wt % of the thermally activated delayed fluorescence material, and accordingly, a content change of the thermally activated delayed fluorescence material has no influence on peaks, full widths at half maximum (FWHM), and color coordinates of the emission spectra.

Accordingly, referring to the results of Table 5 and FIG. 12, Example 5 including a predetermined amount of the thermally activated delayed fluorescence material in the hole transport layer exhibits excellent luminous efficiency compared with Comparative Example 3.

Figure 13:
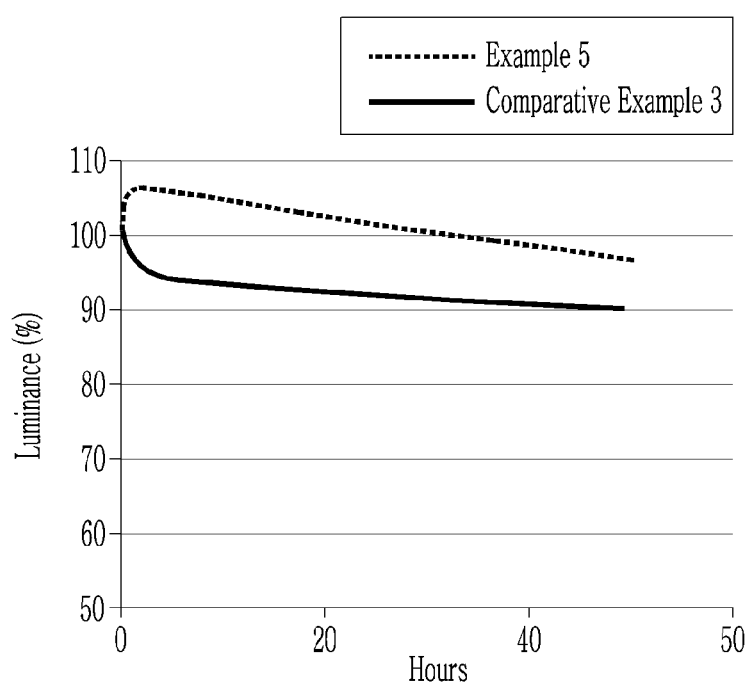
FIG. 13 is a graph of luminance (%) versus hours of the electroluminescent devices of Example 5 and Comparative Example 3.
Figure 14:
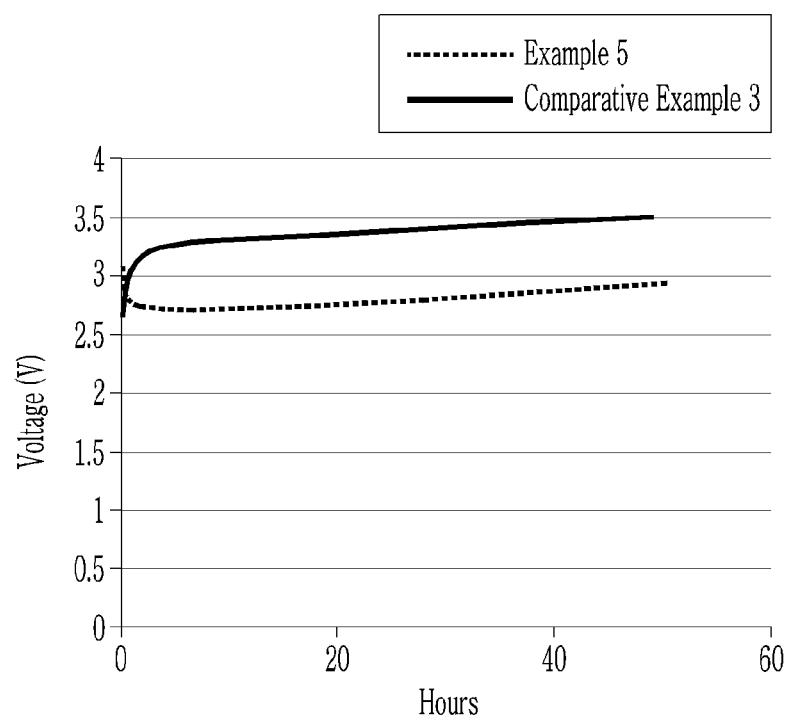
FIG. 14 is a graph of voltage (V) versus hours of the electroluminescent devices of Example 5 and Comparative Example 3.

The time-external quantum efficiency and time-driving voltage of the electroluminescent devices of Example 5 and Comparative Example 3 are measured, and the results are shown in Table 6 and FIGS. 13 and 14.

TABLE 6

| | T95 (h) | Injection current (mA) | Initial luminance (nits) | Initial driving voltage (①) (V) | Driving voltage @ 45 h (②) (V) | ΔV (=②−①) (V) |
|---|---|---|---|---|---|---|
| Ex. 5 | 60 | 0.21 | 1,500 | 3.1 | 2.9 | 0.2 |
| Comp. Ex. 3 | 2.75 | 0.29 | 1,500 | 2.7 | 3.5 | 0.8 |

FIG. 13 is a graph showing time-device luminance (a relative value) of the electroluminescent devices of Example 5 and Comparative Example 3, and FIG. 14 is a graph showing time-driving voltage of the electroluminescent devices of Example 5 and Comparative Example 3. Referring to Table 6 and FIGS. 13 to 14, Example 5 exhibits greatly (about 21.8 times) higher T95 than Comparative Example 3, and in addition, Example 5 exhibits a clearly low driving voltage change depending on time compared with Comparative Example 3.

Accordingly, referring to the results of Table 6 and FIGS. 13 to 14, Example 5 including a predetermined amount of the thermally activated delayed fluorescence material in the light emitting layer exhibits excellent life-span characteristics and in addition, delayed degradation of the hole transport layer by excess electrons compared with Comparative Example 3.

Evaluation 4: Light Emitting and Life-span Characteristics of Dual Light Emitting Layer Electroluminescent Device Including Thermally Activated Delayed Fluorescence Material in Light Emitting Layer The luminescence properties of the electroluminescent devices of Example 6 and Comparative Example 4 are measured and the results are shown in Table 7.

TABLE 7

| | Maximum EQE (%) | Maximum luminance (cd/m²) | EQE @ 50,000 nits (%) | Maximum current efficiency (cd/A) | Driving voltage @ 5 mA/cm² (V) | Luminance @ 5 mA/cm² (cd/m²) | Driving voltage @ 1,000 nits (V) | Peak emission wavelength (nm) | Full width at half maximum (FWHM) (nm) | CIE x | CIE y |
|---|---|---|---|---|---|---|---|---|---|---|---|
| Ex. 6 | 11.7 | 116,170 | 8.5 | 14.4 | 2.6 | 698 | 2.7 | 628 | 34 | 0.6876 | 0.3120 |
| Comp. Ex. 4 | 11.8 | 100,480 | 8.5 | 14.4 | 2.7 | 704 | 2.7 | 628 | 35 | 0.6880 | 0.3117 |

Referring to Table 7, the dual light emitting layer electroluminescent device of Example 6 including the thermally activated delayed fluorescence material in the first layer exhibits almost equivalent luminescence properties compared with Comparative Example 4 having the same light emitting layer thickness, and accordingly, even though the thermally activated delayed fluorescence material is included in the first light emitting layer, there is almost no influence on peaks, full widths at half maximum (FWHM), or color coordinates of the emission spectra. Accordingly, referring to the results of Table 7, even though a dual light emitting layer electroluminescent device is configured to include the first layer including the thermally activated delayed fluorescence material and the second layer including no thermally activated delayed fluorescence material, the dual light emitting layer electroluminescent device exhibits equivalent luminous efficiency to that of a single layer light emitting device including no thermally activated delayed fluorescence material.

Figure 15:
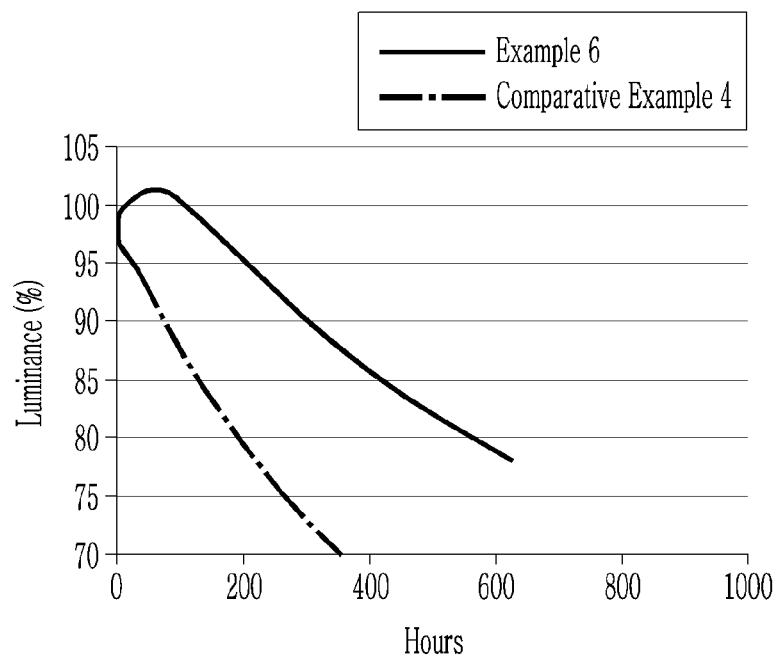
FIG. 15 is a graph of luminance (%) versus hours of the electroluminescent devices of Example 6 and Comparative Example 4.

Time-external quantum efficiency and time-driving voltage of the electroluminescent devices of Example 6 and Comparative Example 4 are measured, and the results are shown in Table 8 and FIG. 15.

TABLE 8

| | T95 @ 4,500 nits (h) | T80 @ 4,500 nits (h) |
|---|---|---|
| Example 6 | 206.97 | 600 |
| Comparative Example 4 | 24.28 | 194.3 |

FIG. 15 is a graph showing time-device luminance (a relative value) of the electroluminescent devices of Example 6 and Comparative Example 4. Referring to Table 8 and FIG. 15, Example 6 exhibits about 3 times to about 10 times higher T95 and T80 than Comparative Example 4 and a similar driving voltage change depending on a time change to that of Comparative Example 4.

Accordingly, referring to the results of Table 8 and FIG. 15, the dual light emitting layer electroluminescent device including the thermally activated delayed fluorescence material exhibits excellent life-span characteristics compared with the single light emitting layer electroluminescent device.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

<Description of Symbols>

10: electroluminescent device
34: thermally activated delayed fluorescence material
100: substrate
110: first electrode
120: hole injection layer
130: hole transport layer
140: light emitting layer
140a: first layer
140b: second layer
141: quantum dot
150: electron transport layer
160: second electrode

What is claimed is:
1. An electroluminescent device comprising
a first electrode and a second electrode facing each other;
a light emitting layer disposed between the first electrode and the second electrode, the light emitting layer comprising a quantum dot;
a hole transport layer disposed between the light emitting layer and the first electrode; and an electron transport layer disposed between the light emitting layer and the second electrode, wherein the hole transport layer comprises a thermally activated delayed fluorescence material, and the thermally activated delayed fluorescence material is present in an amount of greater than or equal to about 0.01 weight percent and less than about 10 weight percent, based on 100 weight percent of the hole transport layer comprising the thermally activated delayed fluorescence material.

2. The electroluminescent device of claim 1, wherein a difference between a highest occupied molecular orbital energy level of the thermally activated delayed fluorescence material and a highest occupied molecular orbital energy level of the material having the hole transporting property is in a range of about −1.0 electronvolts to about 1.0 electronvolt.

3. The electroluminescent device of claim 2, wherein the hole transport layer is directly on with the light emitting layer.

4. The electroluminescent device of claim 1, wherein the thermally activated delayed fluorescence material has a highest occupied molecular orbital energy level of about −6.1 electronvolts to about −5.2 electronvolts and a lowest unoccupied molecular orbital energy level of about −3.6 electronvolts to about −2.0 electronvolts.

5. The electroluminescent device of claim 1, wherein the thermally activated delayed fluorescence material comprises 9'-[4-(4,6-diphenyl-1,3,5-triazin-2-yl)phenyl]-3,3'', 6,6''-tetraphenyl-9,3':6',9''-ter-9H-carbazole, 2,3,4,6-tetra(9H-carbazol-9-yl)-5-fluorobenzonitrile, 10,10'-(4,4'-sulfonyl bis(4,1-phenylene)) bis(9,9-dimethyl-9,10-dihydroacridine), 9'-[4-(4,6-diphenyl-1,3,5-triazin-2-yl)phenyl]-9,3':6',9''-ter-9H-carbazole, 9,9'-(5-(4,6-diphenyl-1,3,5-triazin-2-yl)-1,3-phenylene)bis(9H-carbazole), 9,9',9'',9'''46-phenyl-1,3,5-triazine-2,4-diyl)bis(benzene-5,3,1-triyl))tetrakis (9H-carbazole), 9,9'-(4,4'-sulfonylbis(4,1-phenylene))bis(3,6-di-tert-butyl-9H-carbazole), 10,10'-(4,4'-(4-phenyl-4H-1,2,4-triazole-3,5-diyl)bis(4,1-phenylene))bis(10H-phenoxazine), or a combination thereof.

6. The electroluminescent device of claim 1, wherein the thermally activated delayed fluorescence material has a peak emission wavelength of less than or equal to about 480 nanometers.

7. The electroluminescent device of claim 1, wherein the quantum dot comprises a Group II-VI compound that does not comprise Cd, a Group III-V compound, a Group IV-VI compound, a Group IV element or compound, a Group I compound, a Group I-II-IV-VI compound that does not comprise Cd, or a combination thereof.

8. The electroluminescent device of claim 1, wherein the quantum dot has a core-shell structure.

9. The electroluminescent device of claim 1, wherein a hydrophobic ligand is attached to a surface of the quantum dot.

10. The electroluminescent device of claim 1, wherein the electron transport layer comprises an inorganic nanoparticle, a quinolone compound, a triazine compound, a quinoline compound, a triazole compound, a naphthalene compound, or a combination thereof.

11. The electroluminescent device of claim 10, wherein the electron transport layer comprises a population layer comprising inorganic nanoparticles.

12. The electroluminescent device of claim 1, further comprising a hole injection layer between the first electrode and the hole transport layer.

13. A display device comprising the electroluminescent device of claim 1.

14. An electroluminescent device comprising
a first electrode and a second electrode facing each other;
a light emitting layer disposed between the first electrode and the second electrode, the light emitting layer comprising a quantum dot;
a hole transport layer disposed between the light emitting layer and the first electrode; and
an electron transport layer disposed between the light emitting layer and the second electrode,
wherein the light emitting layer comprises a first layer directly on the hole transport layer and a second layer disposed between the first layer and the electron transport layer,
the first layer comprises a thermally activated delayed fluorescence material and the second layer is substantially free of the thermally activated delayed fluorescence material, and
the thermally activated delayed fluorescence material is present in an amount of greater than or equal to about 0.01 weight percent and less than about 10 weight percent, based on 100 weight percent of the first layer comprising the thermally activated delayed fluorescence material.

15. The electroluminescent device of claim 14, wherein a difference between a highest occupied molecular orbital energy level of the thermally activated delayed fluorescence material and a highest occupied molecular orbital energy level of the quantum dot is in a range of about −1.0 electronvolts to about 1.0 electronvolt.

16. The electroluminescent device of claim 14, wherein each of the first layer and the second layer emits a first light belonging to a same predetermined wavelength region.

17. The electroluminescent device of claim 16, wherein the first light belongs to a first wavelength region of about 380 nanometers to about 488 nanometers, a second wavelength region of about 490 nanometers to about 510 nanometers, a third wavelength region of about 511 nanometers to about 580 nanometers, a fourth wavelength region of about 582 nanometers to about 600 nanometers, or a fifth wavelength region of about 620 nanometers to about 680 nanometers.

18. The electroluminescent device of claim 14, wherein each of the first layer and the second layer has a thickness of about 1 nanometer to about 30 nanometers.

19. The electroluminescent device of claim 14, wherein the second layer has a thickness less than or equal to the first layer.

\* \* \* \* \*